US006743297B2

(12) United States Patent
Egashira et al.

(10) Patent No.: US 6,743,297 B2
(45) Date of Patent: Jun. 1, 2004

(54) ROTARY SUBSTRATE PROCESSING APPARATUS AND METHOD

(75) Inventors: Koji Egashira, Tosu (JP); Sadayuki Fujishima, Tosu (JP); Yuji Kamikawa, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/151,092

(22) Filed: May 21, 2002

(65) Prior Publication Data

US 2002/0170571 A1 Nov. 21, 2002

(30) Foreign Application Priority Data

May 21, 2001 (JP) ........................................ 2001-150854

(51) Int. Cl.⁷ ................................................. B08B 3/00
(52) U.S. Cl. ............. 118/730; 156/345.23; 156/345.55; 134/59
(58) Field of Search ........................ 156/345.23, 345.55; 118/730, 500; 414/937, 939; 134/159

(56) References Cited

U.S. PATENT DOCUMENTS 5,339,539 A  * 8/1994 Shiraishi et al. ................ 34/58
5,435,075 A  * 7/1995 Shiraishi et al. ................ 34/58
6,568,412 B2 * 5/2003 Egashira ..................... 134/159

FOREIGN PATENT DOCUMENTS

JP           7-97005         4/1995

* cited by examiner

*Primary Examiner*—Gregory Mills
*Assistant Examiner*—Sylvia R. MacArthur
(74) *Attorney, Agent, or Firm*—Smith, Gambrell & Russell, LLP

(57) ABSTRACT

A rotary substrate processing apparatus includes a rotor 1 having a holding member for holding a plurality of semiconductor wafers W arranged at appropriate intervals and a motor 4 for rotating the rotor 1. The holding member includes open/close holding rods 3 that are moved to open or close the rotor 1 in inserting the wafers W into the rotor 1 sideways and a plurality of constant-position holding rods 2a to 2d for holding the wafers W in cooperation with the open/close holding rods 3. Among the constant-position holding rods 2a to 2d, at least one constant-position holding rod 2a is equipped with a plurality of press members 5 which move toward respective peripheral portions of the wafers W by centrifugal force due to the rotation of the rotor 1. Consequently, it becomes possible to make the wafers W follow the rotation of the rotor 1 ensurely and also possible to reduce slip between the open/close holding rods 3, the constant-position holding rods 2a to 2d and the wafers W. Therefore, it is possible to accomplish both improvement in processing efficiency for the substrates and reduction in abrasion amount of the holding member and also possible to increase a life span of the apparatus.

12 Claims, 14 Drawing Sheets

ROTARY SUBSTRATE PROCESSING APPARATUS AND METHOD

BACKGROUND OF THE INVENTION

1. Technical Field of the Invention

This invention relates to a rotary substrate processing apparatus for processing a substrate to be processed, such as semiconductor wafer, by using liquid, for example, chemical liquid, pure water, etc. Further, the invention also relates to a rotary substrate processing method for processing the substrate by using the above liquid.

2. Description of the Related Art

In the rotary substrate processing apparatus of this kind, there is known a rotary substrate processing apparatus that includes a rotor capable of holding a plurality of disc-shaped substrates (e.g. semiconductor wafers) parallel with each other. In this rotary substrate processing apparatus, the rotor is provided with holding members for supporting the peripheral portions of the substrates, for example, a plurality of holding rods. Thus, the abutment of the holding rods against the peripheral portions of the substrates enables the rotor to retain them. Each of the holding rods is provided, at its positions in contact with the substrates, with a plurality of guide grooves at regular intervals, which allow the substrates to be retained in stability.

In the rotary substrate processing apparatus constructed above, by spraying liquid (e.g. chemical liquid, pure water, etc.) against the substrates while rotating the rotor at designated revolutions, it becomes possible to eliminate contaminants, such as particles and organic pollutant, resist films, oxidation films, etc. from the substrates uniformly. Additionally, since centrifugal force due to the rotation of the rotor causes the liquid to be blown off, it is possible to dry the substrates.

In the above rotary substrate processing apparatus, however, it cannot produce sufficient effect in accordance with a processing program because the substrates cannot rotate while following the rotor rotating at a high speed.

Additionally, the holding condition between the substrates and the holding rods becomes uneven due to the presence of dimensional errors among the substrates. Therefore, the substrates cannot be processed uniformly, so that there is the possibility of reducing the processing efficiency.

Furthermore, when the rotor begins to rotate or stops its rotation, there is produced, between each holding rod and the substrates, a slip which causes a great abrasion of the holding rods. Therefore, the holding rods have to be exchanged to new ones ahead of time.

SUMMARY OF THE INVENTION

Taking the above situation into consideration, an object of the present invention is to provide rotary substrate processing apparatus and method, both of which allow a plurality of substrates to follow the rotation of the rotor certainly thereby to improve the processing efficiency for the substrates and which reduce a slip between the holding member of the rotor and the substrates as possible, thereby to reduce abrasion of the holding member and increase their life spans.

The first feature of the present invention resides in the provision of a rotary substrate processing apparatus comprising a rotor having a holding member for holding a plurality of substrates at intervals and a motor for rotating the rotor, the motor being adjustable in its revolutions, wherein the holding member includes at least one open/close holding rod which moves to open or close the rotor in inserting the substrates into the rotor and a plurality of fixed holding rods for holding the substrates in cooperation with the open/close holding rod, and at least one of the fixed holding rods has a plurality of press members that are moved toward peripheral portions of the respective substrates by centrifugal force due to the rotation of the rotor thereby to press the substrates.

According to the second feature of the present invention, in the rotary substrate processing apparatus of the first feature, the press members have respective fitting holes into which a single support shaft is inserted in common, the press members being adapted so as to be slidable in the circumferential direction of the support shaft.

According to the third feature of the present invention, in the rotary substrate processing apparatus of the first feature, the open/close holding rod includes a press body having a press piece capable of elastic deformation, the press piece being adapted so as to move toward peripheral portions of the respective substrates by centrifugal force due to the rotation of the rotor thereby to press the substrates.

According to the fourth feature of the present invention, in the rotary substrate processing apparatus of the first feature, the open/close holding rod is provided with elastically-deformable holding grooves which are swollen toward peripheral portions of the respective of the substrates by pressure of a fluid supplied to the open/close holding rod thereby to press the substrates.

According to the fifth feature of the present invention, in the rotary substrate processing apparatus of the first feature, the press members have respective fitting holes into which a single support shaft is inserted in common and the press members each comprises a plate body rotatably fitted to the support shaft, the plate body having a press part formed on a circumferential face of the plate body, a weight embedded in the plate body in an eccentric position thereof and a guide groove formed in the plate body, for engagement with a rotation stopper shaft with play, the rotation stopper shaft being arranged to extend in parallel with the support shaft.

According to the sixth feature of the present invention, in the rotary substrate processing apparatus of the fifth feature, each of the press members has at least one discharge groove formed on its surface perpendicular to the support shaft to extend from the center of the support shaft outward.

According to the seventh feature of the present invention, in the rotary substrate processing apparatus of the fifth feature, the plate body is provided with a drain hole which communicates a sliding face of the plate body on the support shaft with the circumferential face of the plate body.

The eighth feature of the present invention resides in the provision of a rotary substrate processing apparatus comprising a rotor having a holding member for holding a plurality of substrates at intervals and a motor for rotating the rotor, the motor being adjustable in its revolutions, wherein the holding member includes at least one open/close holding rod which moves to open or close the rotor in inserting the substrates into the rotor and a plurality of fixed holding rods for holding the substrates in cooperation with the open/close holding rod and the at least one open/close holding rod and/or at least one of the fixed holding rods includes a press body having an elastically-deformable press piece adapted so as to move toward peripheral portions of the respective substrates by centrifugal force due to the rotation of the rotor thereby to press the substrates.

According to the ninth feature of the present invention, in the rotary substrate processing apparatus of the eighth feature, the open/close holding rod includes a press body having an elastically-deformable press piece adapted so as to move toward peripheral portions of the respective substrates by centrifugal force due to the rotation of the rotor thereby to press the substrates.

According to the tenth feature of the present invention, in the rotary substrate processing apparatus of the eighth feature, at least one of the fixing holding rod is provided with elastically-deformable holding grooves which are swollen toward peripheral portions of the respective substrates by pressure of a fluid supplied to the fixing holding rod thereby to press the substrates.

The eleventh feature of the present invention resides in the provision of a rotary substrate processing apparatus comprising a rotor having a holding member for holding a plurality of substrates at intervals and a motor for rotating the rotor, the motor being adjustable in its revolutions, wherein the holding member includes at least one open/close holding rod which moves to open or close the rotor in inserting the substrates into the rotor and a plurality of fixed holding rods for holding the substrates in cooperation with the open/close holding rod, and at least one holding rod of the open/close holding rod and/or the fixed holding rods includes elastically-deformable holding grooves which are swollen toward peripheral portions of the respective substrates by pressure of a fluid supplied to the holding rod thereby to press the substrates.

According to the twelfth feature of the present invention, the rotary substrate processing apparatus of the eleventh feature further comprises a pressure controller which controls the pressure of the fluid supplied to the holding rod.

The thirteenth feature of the present invention resides in the provision of a rotary substrate processing method for processing a plurality of substrates while rotating a rotor having a plurality of holding members for holding the substrates at intervals by means of a motor, the method comprising the steps of allowing at least one of the holding members to press the substrates with centrifugal force due to the rotation of the rotor, and supplying the substrates with a processing liquid during the rotation of the rotor.

The fourteenth feature of the present invention resides in the provision of a rotary substrate processing method for processing a plurality of substrates while rotating a rotor having a holding member for holding the substrates at intervals by means of a motor, the method comprising the steps of allowing the holding member to have a function to change a pressure on the substrates by centrifugal force due to the rotation of the rotor, controlling the rotation of the rotor thereby to strengthen or loosen a holding force of the holding member for the substrates, and discharging a liquid adhering between the substrates and the holding member when loosening the holding force of the holding member for the substrates.

The fifteenth feature of the present invention resides in the provision of a rotary substrate processing method for processing a plurality of substrates while rotating a rotor having a holding member for holding the substrates at intervals by means of a motor, the method comprising the steps of allowing the holding member to have a function to change a pressure on the substrates by fluid pressure, controlling the fluid pressure thereby to strengthen or loosen a holding force of the holding member for the substrates, and discharging a liquid adhering between the substrates and the holding member when loosening the holding force of the holding member for the substrates.

Hereat, the term "loosening" means weakening a holding force of each holding member for the substrates thereby to define a slight gap between each substrate and the holding member.

According to the present invention characterized by the first, third, fourth, eighth and the ninth features, since at least one of the fixed holding rods for holding the substrates in cooperation with the open/close holding rod, has the press members moving toward peripheral portions of the respective the substrates by centrifugal force due to the rotation of the rotor or the press body having the elastically-deformable press piece adapted so as to move toward peripheral portions of the respective substrates by centrifugal force due to the rotation of the rotor, it is possible to make the substrates follow the rotation of the rotor certainly. Thus, it is possible to enhance the rotating accuracy of the substrates, thereby improving both processing efficiency and reliability of the apparatus. Additionally, since the slip between the holding member of the rotor and the substrates is reduced, it is possible to reduce the abrasion amount of the holding member, whereby the exchanging cycle of the holding member can be extended while increasing the life span of the apparatus.

According to the present invention characterized by the third, eighth, ninth and the tenth features, since the open/close holding rod for holding the substrates in cooperation with the fixed holding rods has the press body having the elastically-deformable press piece adapted so as to move toward peripheral portions of the respective substrates by centrifugal force due to the rotation of the rotor, it is possible to make the substrates follow the rotation of the rotor certainly. Thus, it is possible to enhance the rotating accuracy of the substrates, thereby improving both processing efficiency and reliability of the apparatus. Additionally, since the slip between the holding member of the rotor and the substrates is reduced, it is possible to reduce the abrasion amount of the holding member, whereby the exchanging cycle of the holding member can be extended while increasing the life span of the apparatus.

According to the present invention characterized by the eleventh feature, since the open/close holding rod and/or at least one holding rod of the fixed holding rods includes elastically-deformable holding grooves which are swollen toward peripheral portions of the respective substrates by pressure of a fluid supplied to the holding rod, it is possible to make the substrates follow the rotation of the rotor certainly. Thus, it is possible to enhance the rotating accuracy of the substrates, thereby improving both processing efficiency and reliability of the apparatus. Additionally, since the slip between the holding member of the rotor and the substrates is reduced, it is possible to reduce the abrasion amount of the holding member, whereby the exchanging cycle of the holding member can be extended while increasing the life span of the apparatus.

According to the present invention characterized by the fifth feature, since the press members each comprises the press part formed on the circumferential face of the plate body rotatably fitted to the support shaft through spacers and the weight embedded in the plate body in its eccentric position, it is possible to certainly make the press members press the peripheral portions of the substrates by centrifugal force due to the rotation of the rotor. Additionally, it is possible to make the substrates follow the rotation of the rotor certainly and also possible to reduce the slip between the holding member of the rotor and the substrates. Again, since each of the press members is provided with the guide groove for engagement with the rotation stopper shaft with play, the rotation stopper shaft being arranged to extend in parallel with the support shaft, it is possible to define a rotational range of the press member between its pressing position and the non-pressing position. Therefore, it is possible to allow the press members to follow the rotation of the rotor and also press the peripheral portions of the substrates quickly. In this case, as the present invention characterized by the sixth feature, by forming one or more fluid discharge grooves on each press member's surfaces in contact with the spacers, the fluid discharge groove extending from the center of rotation and opening to the outside, it is possible to discharge liquid, particles, etc. adhering between the press members and the spacers.

According to the present invention characterized by the thirteenth feature, the processing liquid is supplied to process the substrates while pressing them by at least one of the holding members with centrifugal force due to the rotation of the rotor. Therefore, if rotating means for rotating the rotor at high speed, then it is possible to strengthen a holding force of the holding member thereby to make the substrates follow the rotation of the rotor certainly. Then, it is possible to process the substrates in accordance with a designated processing program uniformly.

According to the present invention characterized by the fourteenth feature, the holding force of the holding member for the substrates can be strengthened or loosened by controlling the rotation of the rotor. Therefore, if rotating means for rotating the rotor at high speed, then it is possible to strengthen the holding force of the holding member thereby to make the substrates follow the rotation of the rotor certainly. Conversely, by rotating the rotor at low speed, it is possible to loosen the holding force of the holding member thereby to eliminate the liquid adhering between the substrates and the holding member. Thus, by controlling the rotation of the rotor, it is possible to carry out different process on the substrates continuously and also possible to improve the quality of the substrates as products.

According to the present invention characterized by the twelfth and fifteenth features, the holding force of the holding member for the substrates can be strengthened or loosened by controlling the fluid pressure. Therefore, if raising the fluid pressure, then it is possible to strengthen the holding force of the holding member thereby to make the substrates follow the rotation of the rotor certainly. Conversely, by lowering the fluid pressure, it is possible to loosen the holding force of the holding member thereby to eliminate the liquid adhering between the substrates and the holding member. Thus, by controlling the fluid pressure, it is possible to carry out different process on the substrates continuously and also possible to improve the quality of the substrates as products.

BRIEF DESCRIPTION OF THE DRAWINGS

FIGS. 10A and 10B are enlarged sectional views showing holding grooves of a holding rod of the second embodiment, in which FIG. 1A is a view showing a condition before holding wafers and FIG. 10B is a view showing a condition to hold the wafers;

DESCRIPTION OF THE PREFERRED EMBODIMENT

With reference to FIGS. 1 to 14, embodiments of this invention will be described below, in detail.

[1st. Embodiment]

Figure 1:
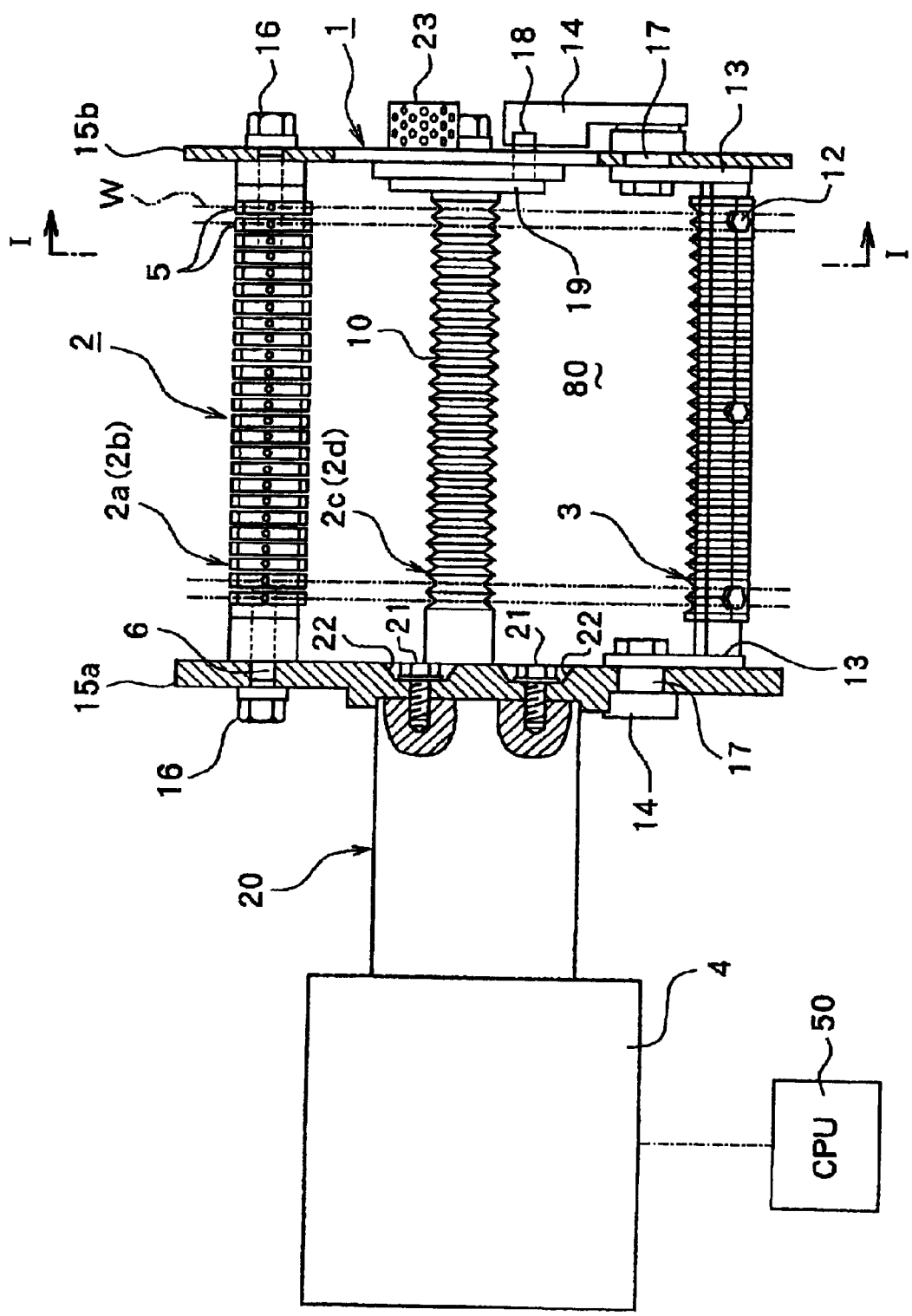
FIG. 1 is a schematic sectional view of a rotary substrate processing apparatus in accordance with the first embodiment of the present invention.
Figure 2:
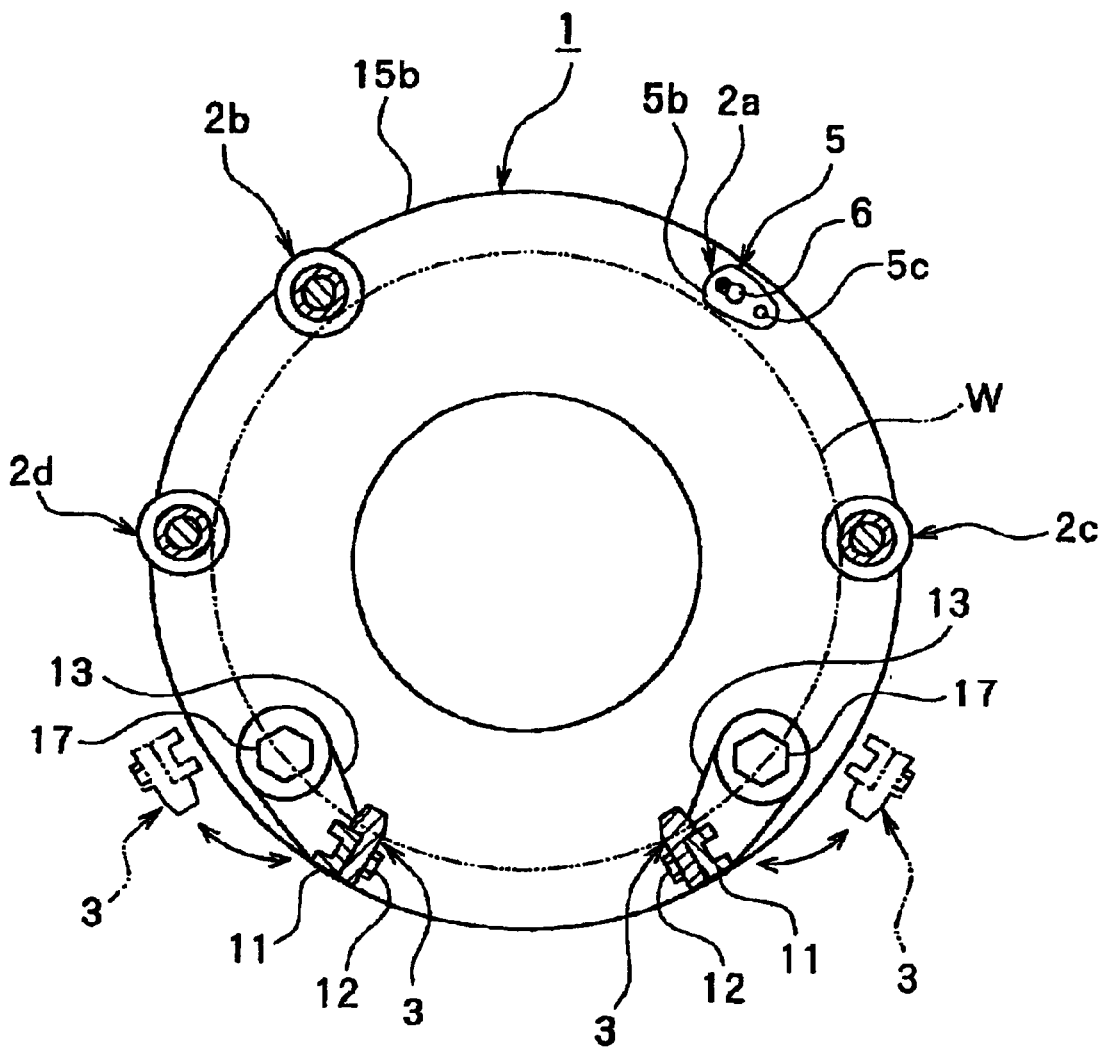
FIG. 2 is a sectional view taken along a line I—I of FIG. 1.
Figure 3A:
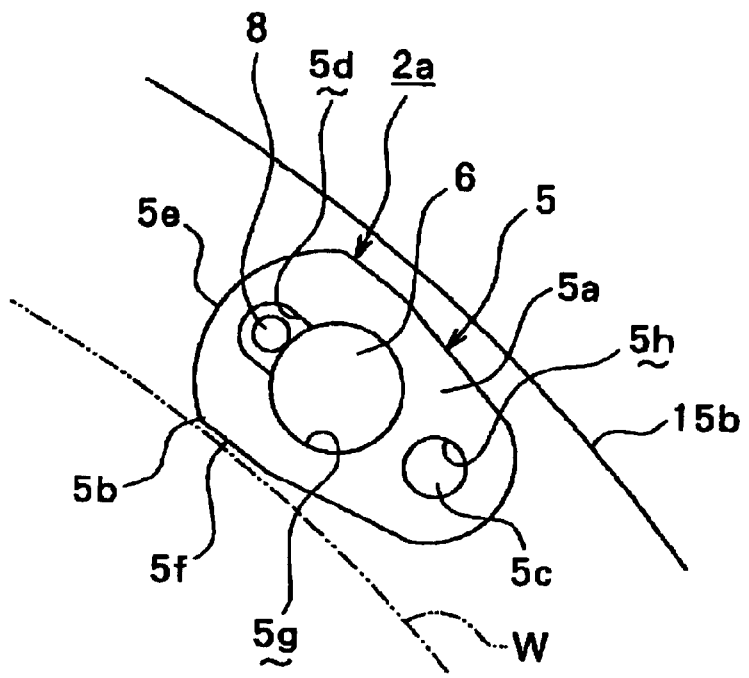
FIG. 3A is an enlarged view showing a condition before a pressing member holds a wafer and FIG. 3B is an enlarged view showing a condition after the pressing member holds the wafer.
Figure 3B:
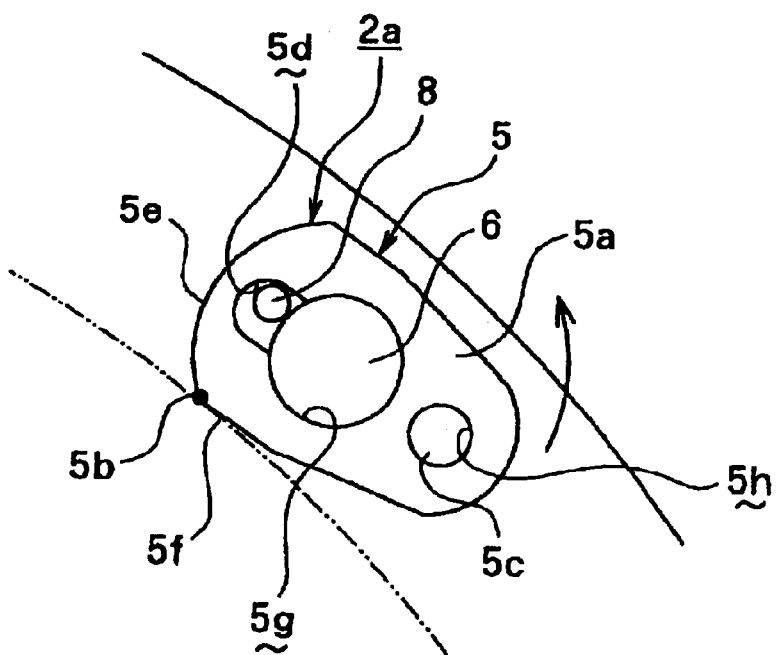

FIG. 1 is a schematic sectional view of a rotary substrate processing apparatus in accordance with the first embodiment of the present invention. FIG. 2 is a sectional view taken along a line I—I of FIG. 1.

As shown in FIGS. 1 and 2, the rotary substrate processing apparatus of this embodiment includes a rotor 1 having a holding member 2 for holding a plurality of substrates, for example, twenty six pieces of semiconductor wafers (which will be referred "wafers W", hereinafter), a revolution-adjustable motor 4 for rotating the rotor 1 and a central processing unit 50 (CPU 50) as a controller that controls the number of revolutions of the motor 4.

The above holding member 2 is equipped with a pair of open/close holding rods 3 which open or close when the wafers W are transferred from a later-mentioned wafer moving mechanism 77 as wafer transporting means (see FIG. 13) into a holding space 80 and a plurality of constant-position holding rods 2a to 2d for holding the wafers W together with the open/close holding rods 3. At least one fixed rod of the fixed holding rods 2a to 2d, for example, the fixed holding rod 2a on the right and upper side of FIG. 2 has a function to enable pressures on the wafers W to be adjusted due to centrifugal force of the rotating rotor 1. That is, the fixed holding rod 2a includes a plurality of press members 5 moving toward the peripheral portions of the wafers W by the centrifugal force resulting from the rotation of the rotor 1 (see FIG. 2, FIG. 3A and FIG. 3B). Then, the fixed holding rods 2a to 2d are positioned on the upside of the horizontal center line of the wafers W and also arranged to be symmetrical with the vertical center line of the wafers W, the number of rods being four. On the other hand, the open/close holding rods 3 are positioned on the underside of the horizontal center line of the wafers W and also arranged to be symmetrical with the vertical center line of the wafers W, the number of rods being two.

Figure 4:
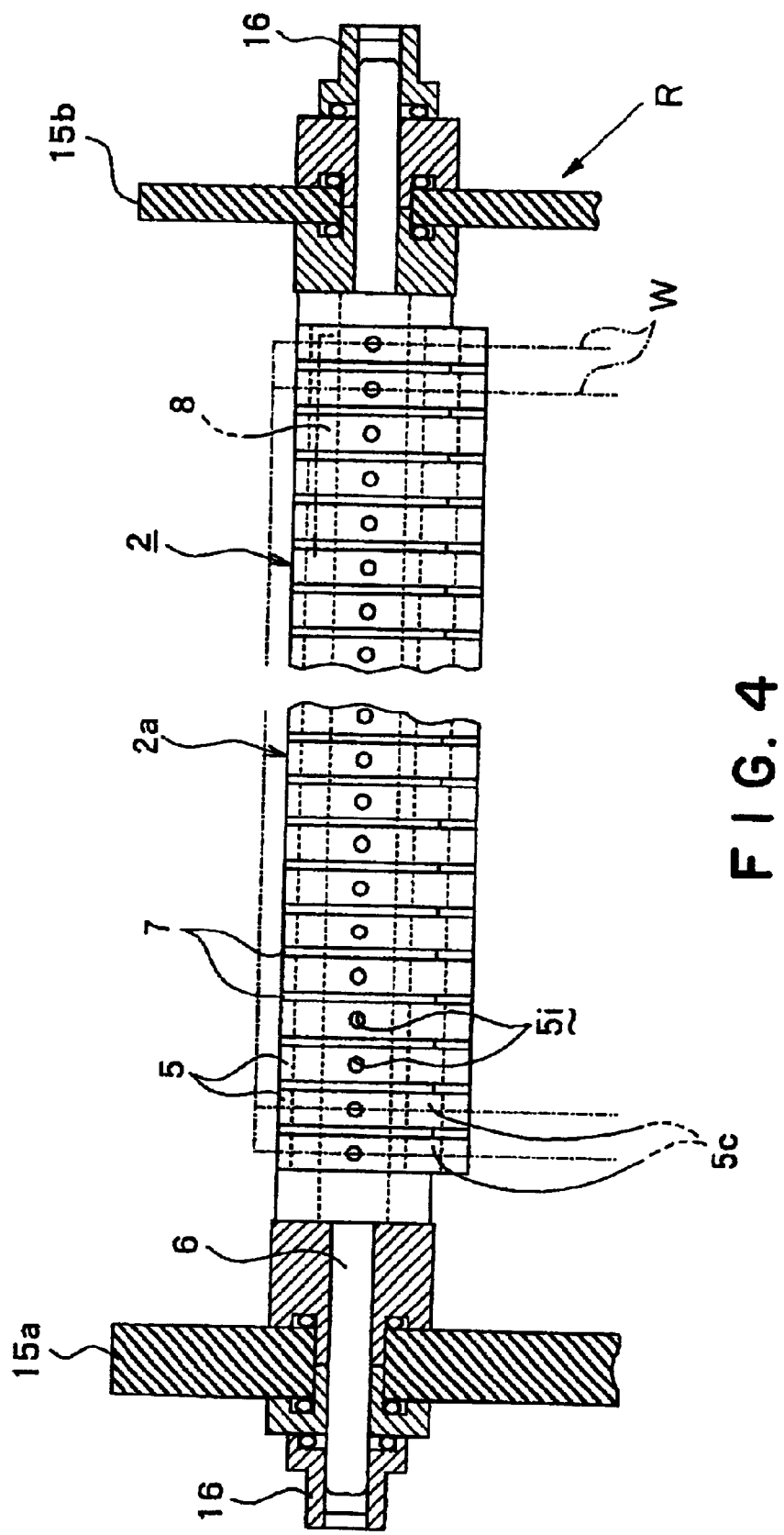
FIG. 4 is a side view showing a holding rod having the pressing members of FIGS. 3A and 3B and positioned in its regular position.
Figure 5A:
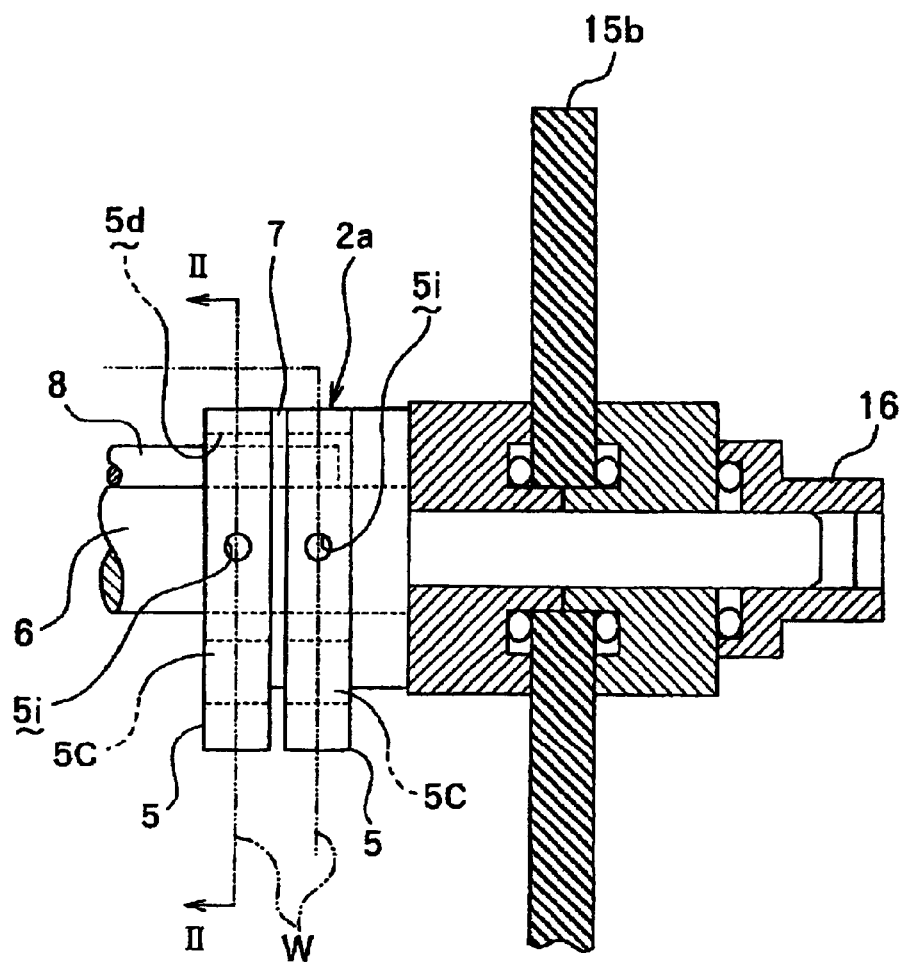
FIG. 5A is an enlarged side view of part "R" of FIG. 4
Figure 5B:
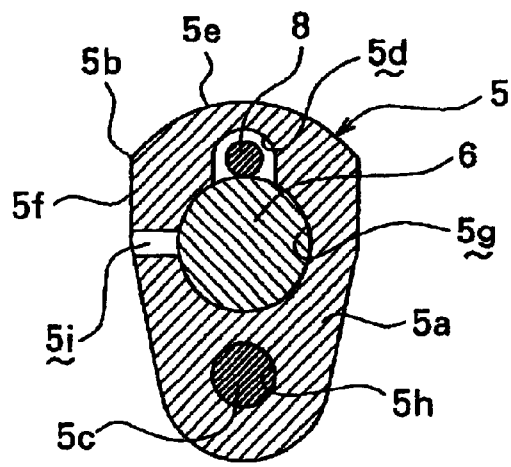
FIG. 5B is a sectional view taken along a line II—II of FIG. 5A.

As shown in FIGS. 4, 5A and 5B, the fixed holding rod 2a includes the press members 5 of the plural number corresponding to the number (26 pcs.) of the wafers W. The press members 5 are rotatably engaged with a support shaft 6, interposing spacers 7 therebetween. Each press member 5 has a plate body 5a made of e.g. PTFE (polytetra fluoroethylane) and provide on its side face, with a press part 5b. Further, the press member 5 includes a weight 5c embedded in the plate body 5a in its eccentric position and a guide groove 5d formed in the plate body 5a to engage with a rotation stopper shaft 8 with play, in parallel with the support shaft 6. Further, the plate body 5a is provided, on its side face, with an arc part 5e and a flat part 5f. The above press part 5b is formed at the intersection between the arc part 5e and the flat part 5f. As shown in FIG. 5B, the plate body 5a has a weight fitting hole 5h formed so as to oppose a fitting hole 5g for the support shaft 6. Inserted into the weight fitting hole 5h is the above weight 5c which is made of metal, such as stainless steel. On the opposite side of the weight 5c, the general U-shaped guide groove 5d is formed in succession with the fitting hole 5g. Further, the plate body 5a has a drain hole 5i formed on its side face to communicate with the fitting hole 5g.

Figure 6:
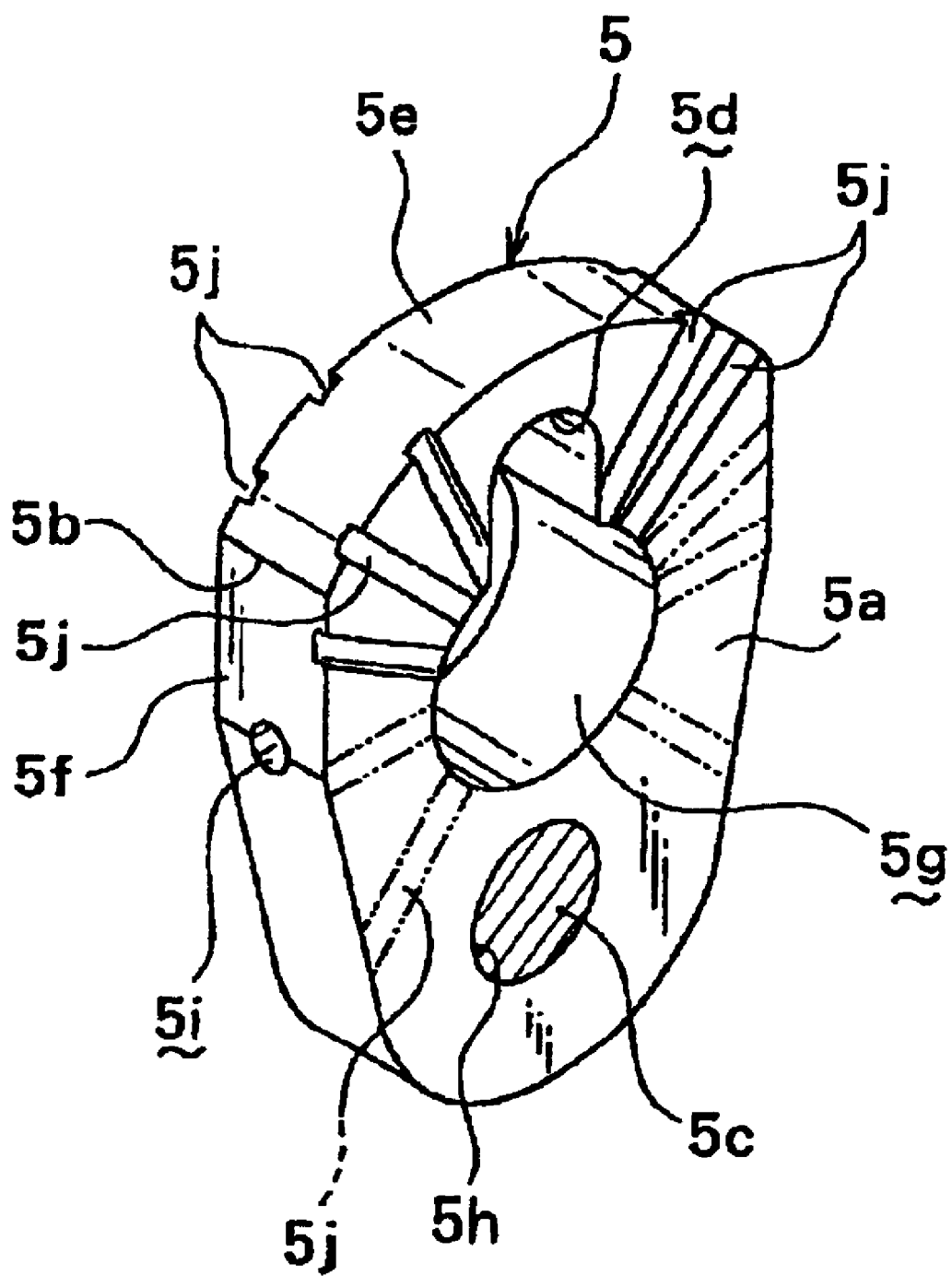
FIG. 6 is a perspective view showing the pressing member.

On both sides of the press member 5 in contact with spacers 7, a plurality of discharge grooves 5j are formed so as to extend from the rotational center outward and open at the periphery of the member 5 (see FIG. 6). It is not necessarily required to provide the discharge grooves 5j as a plural. Alternatively, there may be formed a single discharge groove on the press member 5.

Further, although the fixed holding rod 2a has the spacers 7 each interposed between the adjoining press members 5, it is not necessarily limited to this arrangement. For example, the press member 5 may be provided, on one side thereof, with a projection in the circumference of the fitting hole 5g. In arrangement, the so-formed press members 5 are continuously arranged in such a manner that the projection of each press member 5 abuts against the other side (with no projection) of the adjoining press member 5, performing similar effects to the shown arrangement including the spacers 7.

The other fixed holding rods 2b to 2d are respectively provided, on their circumferences, with guide grooves 10 which guide the peripheral portions of the wafers W and apply urging forces on the same peripheral portions. Further, the fixed holding rods 2b to 2d have respective drain holes (not shown) formed to communicate with the guide grooves 10, for discharging liquid by centrifugal force due to the rotation of the rotor.

Figure 7A:
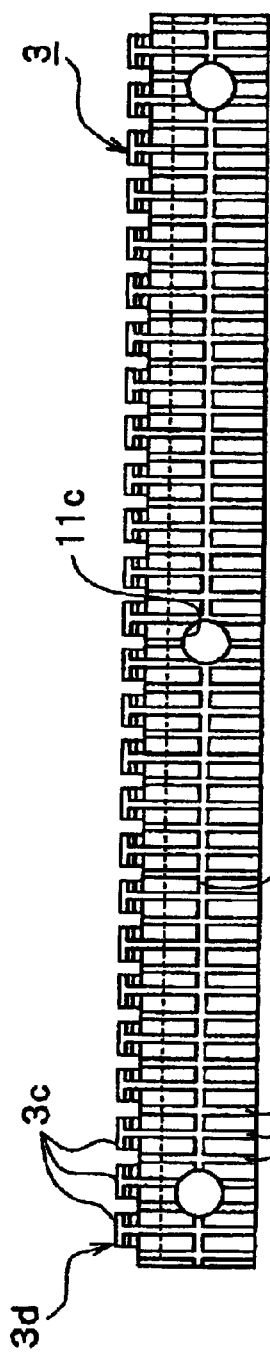
FIG. 7A is a front view showing a closing holding rod.
Figure 7B:
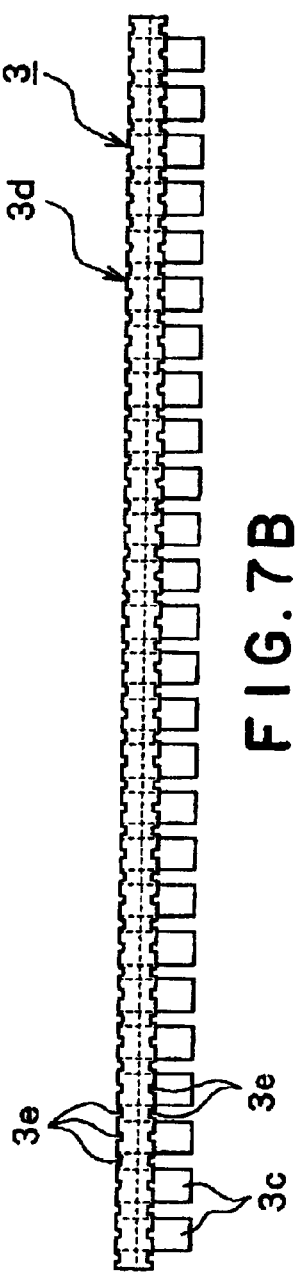
FIG. 7B is a bottom view showing the closing holding rod.
Figure 7C:
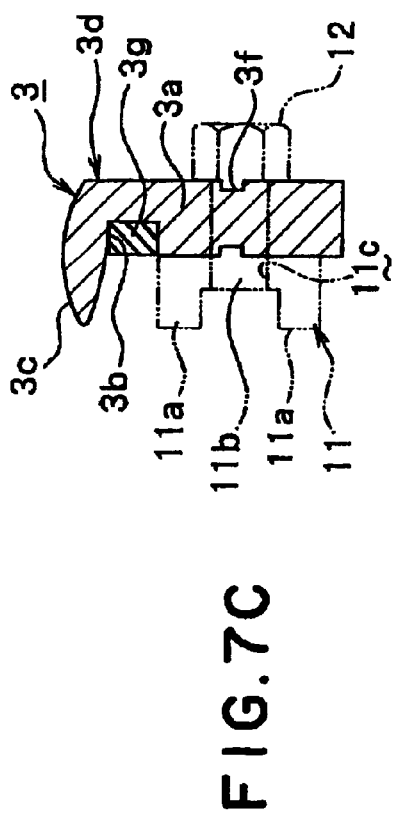
FIG. 7C is an enlarged side view taken along a line III—III of FIG. 7A

Each of the open/close holding rods 3 has a function capable of changing a pressure on the wafers W by centrifugal force due to the rotation of the rotor 1, as similar to the fixed holding rod 2a. That is, as shown in FIGS. 7A, 7B and 7C, the open/close holding rod 3 includes a base part 3a having a rectangular section and extending in a direction perpendicular to the periphery of the wafer W and a press body 3d adjoining the base part 3a through a notch 3b. The press body 3d has a plurality of tongue-shaped press pieces 3c capable of elastic deformation and each having an arc contour periphery. The open/close holding rod 3 is made from elastic material of e.g. PTFE etc. Note, embedded in the notch 3b are reinforcement members 3g which are made from elastic material harder than the material of the rod 3 the notch 3b (see FIG. 7C). On the periphery of the open/close holding rod 3, a plurality of liquid shake-off grooves 3e are formed so as to extend from the press body 3d and the press pieces 3c outward when the holding space 80 is closed so that the press pieces 3c of the body 3d hold the wafers W. The open/close holding rod 3 is fixed to an attachment member 11 by means of attachment bolts 12. For thready engagement with the attachment bolts 12, screw holes 11c are formed so as to penetrate the attachment member 11. That is, the attachment member 11 consists of a pair of ribs 11a and a web 11b connecting the ribs 11a with each other, providing a U-shaped cross section. The attachment member 11 is formed in a manner that the web 11b directs in a direction perpendicular to the peripheral portion of the wafer W when the press pieces 3c of the press body 3d hold the peripheral portions of the wafers W. The screw holes 11c are formed so as to penetrate the web 11b.

As shown in FIG. 2, both ends of the attachment member 11 are connected to respective pivot shafts of a drive cylinder (not shown) through arms 13. Thus, the drive of the drive cylinder allows the movable holding shafts 3 to be opened or closed.

Figure 8:
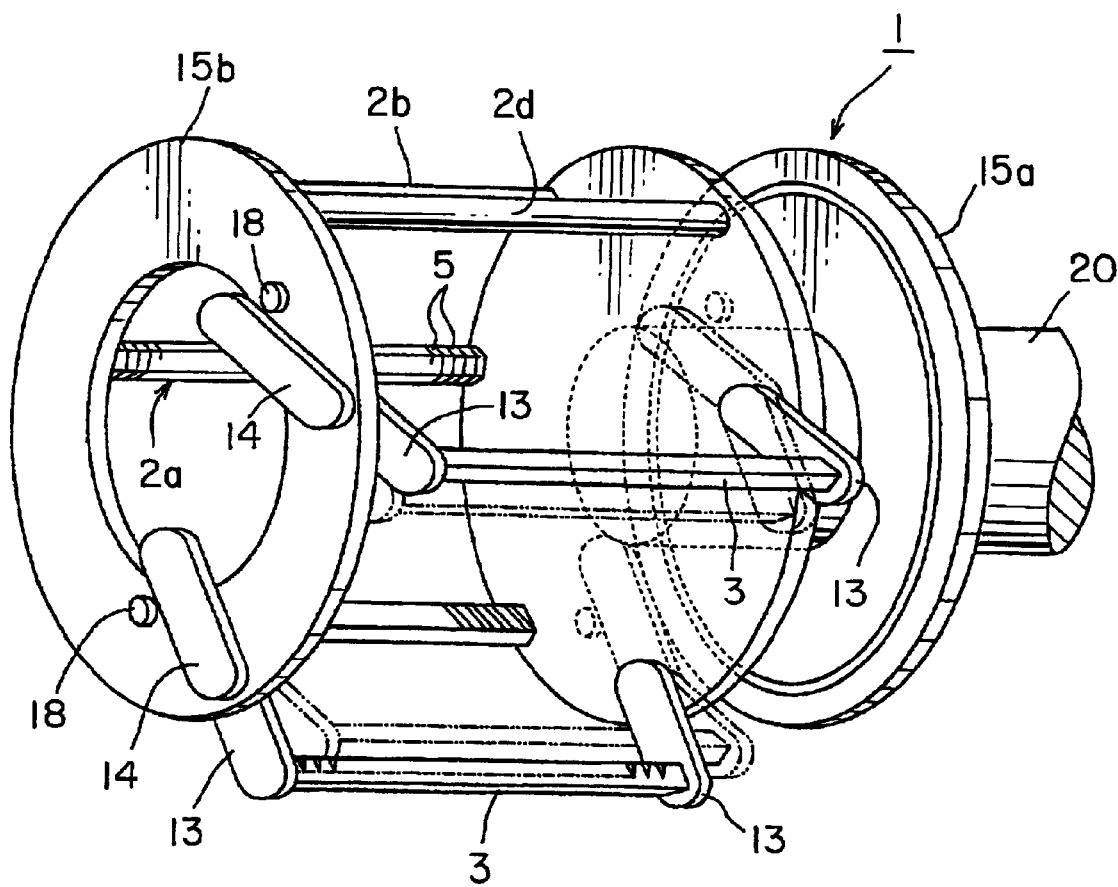
FIG. 8 is a perspective view showing a rotor.

In the open/close holding rods 3, when respective balance weights 14 coupled to the arms 13 are moved by the centrifugal force due to the rotation of the rotor 1, the press pieces 3c of the rods 3 move toward the peripheral portions of the wafers W (see FIG. 8). Note, the rotor 1 may be provided with a single open/close holding rod 3 so long as it allows the wafers W to be inserted into the holding space 80.

The rotor 1 includes a first disc 15a arranged on one side of the holding rods 2a to 2d, 3 and a second disc 15b arranged on the other side of the holding rods 2a to 2d, 3. The fixed holding rods 2a to 2d are fixed to the respective discs 15a, 15b since respective ends of the rods projecting from the discs 15a, 15b are screwed into box nuts 16 respectively.

Note, the first disc 15a is fixed on an end face of a rotary drive shaft 20 associated with the motor 4, by means of bolts 21. Therefore, the first disc 15a is provided with tapered sunk borings 22 for accommodating respective sunk heads of the bolts 21 therein.

As shown in FIG. 1, each of the balance weights 14 is connected with the arm 13 through a connecting shaft 17 penetrating through the disc 15a (15b). Thus, the balance weights 14 can rotate about the connecting shafts 17 due to the centrifugal force by the rotation of the rotor 1. Further, the balance weights 14 are prevented from opening outward excessively by lock pins 18 projecting from the discs 15a, 15b outward (see FIG. 8). Note, the lock pins 18 are arranged to pass through through-holes (not shown) in the discs 15a, 15b. Connecting members 19 are connected with respective ends of the lock pins 18 projecting from the discs 15a, 15b inward. By moving (approaching and separating) the connecting members 19 with respect to the discs 15a, 15b by means of not-shown switching cylinders and also tension springs (not shown) in cover cases 23 on the discs 15a, 15b, the lock pins 18 can be engaged with or disengaged from the balance weights 14. That is, when performing the delivery of the wafers W under condition that the rotation of the rotor 1 is brought to a standstill, the switching cylinders are expanded in opposition to elastic forces of the tension springs. Consequently, the lock pins 18 are moved inside the discs 15a, 15b and brought into respective positions to disengage from the balance weights 14. Under such a situation, the drive cylinder is operated to move the open/close holding rods 3 to their opening positions. Then, the wafers W carried by the wafer transporting mechanism 77 are inserted into the holding space 80 and continuously, the drive cylinder is again operated to move the open/close holding rods 3 to their closing positions. In this way, the wafers W are held by the open/close holding rods 3 and the fixed holding rods 2a to 2d. Subsequently, the separation of the switching cylinders from the connecting members 19 allows the lock pins 18 to project from the discs 15a, 15b outward, due to the elastic forces of the tension springs. As a result, the lock pins 18 can be engaged with the balance weights 14.

Next, the operation of the above rotary substrate processing apparatus will be described. First, the no-shown drive cylinder moves the open/close holding rods 3 to their opening positions thereby to open the holding space 80 and thereupon, the wafers W are inserted into the holding space 80 by the wafer transporting mechanism 77. Next, the holding space 80 is closed by moving the open/close holding rods 3 to their closing positions, establishing a condition that the wafers W are retained in the rotor 1. Then, the wafer transporting mechanism 77 is withdrawn. In this way, the wafers W are supported by the fixed holding rods 2a to 2d and also the open/close holding rods 3, in parallel and certainly. Under such a situation, when rotating the rotor 1 through the rotary drive shaft 20 at predetermined revolutions, for example, 800 rpm, the press members 5 of the fixed holding rod 2a rotates about the support shaft 6 by centrifugal force due to the rotation of the rotor 1, so that the press parts 5b press the peripheral portions of the wafers W (see FIG. 3B). Simultaneously with this rotation, as the balance weights 14 rotate about the connecting shafts 17 by the centrifugal force due to the rotation of the rotor 1, the press bodies 3d of the open/close holding rods 3 move toward the wafers W, so that the press pieces 3c of the bodies 3d are elastically deformed to press the peripheral portions of the wafers W. In this way, the wafers W are held by the fixed holding rods 2a to 2d and the open/close holding rods 3 ensurely and strongly.

While holding the wafers W in the above way, it is performed to spray the chemical liquid, pure water or the like against the wafers W in order to clean them. For removal of liquid adhering to the wafers W, the drying process is carried out to blow inert gas (e.g. $N_2$-gas), volatile and hydrophilic IPA vapor, etc. against the wafers W while rotating the rotor 1 at a higher speed (e.g. 800 rpm) than the rotating speed at the cleaning process.

Additionally, if the centrifugal force due to the rotation of the rotor 1 is decreased by rotating the rotor 1 at a low speed, then the holding forces of the holding rods 2a, 3 decreases to carry the wafers W in their loosened state. That is, since there are produced slight clearances between the wafers W and the holding rods 2a to 2d and 3, it becomes possible to remove liquid and particles from the peripheral portions of the wafers W. Further, if the wafers' portions being held by the holding rods 2a to 2d and 3 are changed by producing a slip between the holding rods 2a to 2d and 3 and the wafers W in decelerating the rotor 1 from high-speed rotations to low-speed rotations, then it also becomes possible to clean the wafers' portions that have been held by the rods hitherto, thereby improving the quality of cleaning process.

It is noted that liquid sticking to a gap between each press member 5 on the fixed holding rod 2a and each spacer 7 is discharged outside through the discharge grooves 5j due to the centrifugal force by the rotation of the rotor 1. Further, liquid sticking to the fitting hole 5g of each press member 5 is discharged outside through the drain holes 5i due to the centrifugal force by the rotation of the rotor 1. Therefore, as the liquid does not continue staying about the fixed holding rods 2a to 2d, the drying period for the wafers W and the rotor 1 can be shortened. In addition, when switching the liquid on use from the chemical liquid to pure water, it is possible to replace the chemical liquid with pure water more quickly.

In each of the open/close holding rods 3, since the shake-off grooves 3e are formed along the periphery of the rod 3 so as to extend from the press body 3d outward (in a direction apart from the wafers W), liquid collected in the press body 3d naturally comes oozing on the side of the shake-off grooves 3e by capillary phenomenon. Accordingly, since the discharge of liquid due to centrifugal force becomes smoother, the drying period for the wafers W and the rotor 1 can be shortened furthermore. Also in this case, when switching the liquid on use from the chemical liquid to pure water, it is possible to replace the chemical liquid with pure water more quickly.

Next, the wafers W cleaned and dried in the above-mentioned way are delivered to the wafer transporting mechanism 77 again.

Note, in the above-mentioned embodiment, one of the fixed holding rods 2a to 2d, that is, the fixed holding rod 2a is equipped with a plurality of press members 5. In the modification, the other fixed holding rods 2b to 2d may be equipped with the press members 5, as well. Alternatively, the open/close holding rod 3 may be equipped with the press members 5. Conversely, at least one of the fixed holding rods 2a to 2d may be equipped with the press body 3d having the press pieces 3c, which is similar to that of the open/close holding rod 3.

[2nd. Embodiment]

Figure 9B:
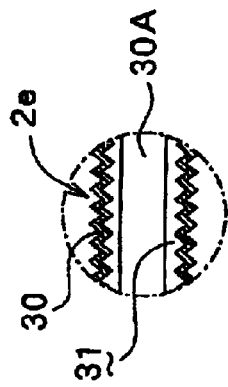
FIG. 9A is a schematic sectional view of the rotary substrate processing apparatus in accordance with the second embodiment of the present invention and FIG. 9B is an enlarged sectional view of a part IV of FIG. 9A.
Figure 9A:
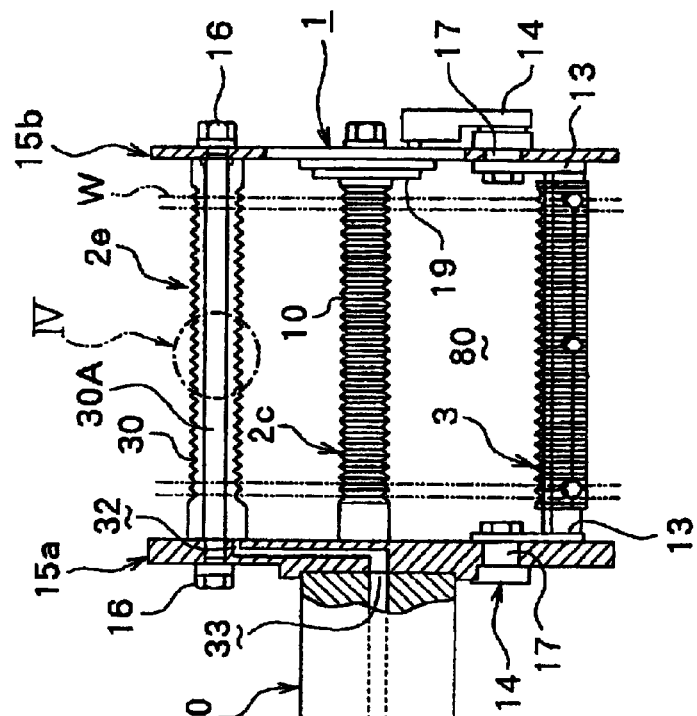
Figure 9A:
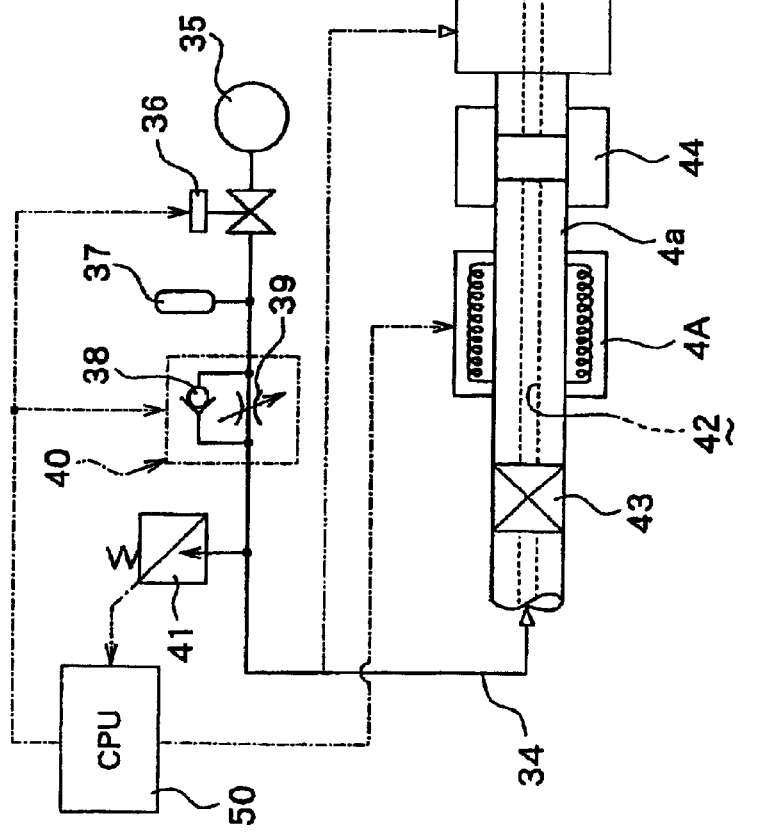
Figure 10A:
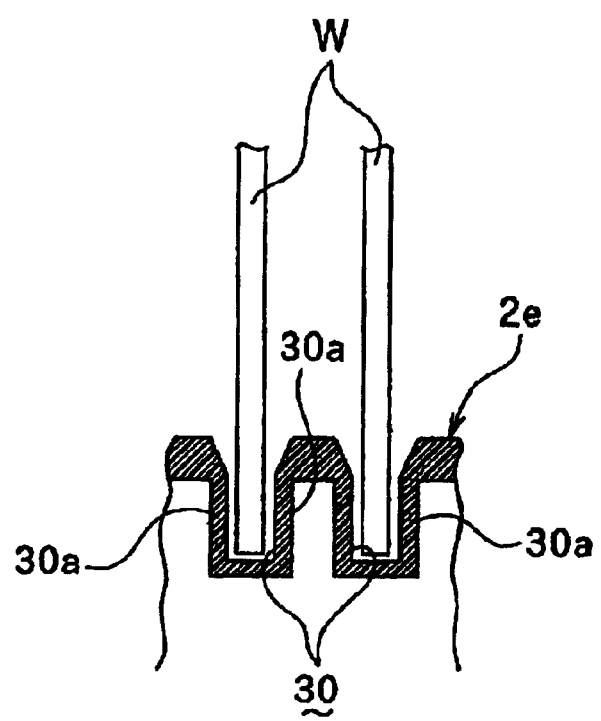
Figure 10B:
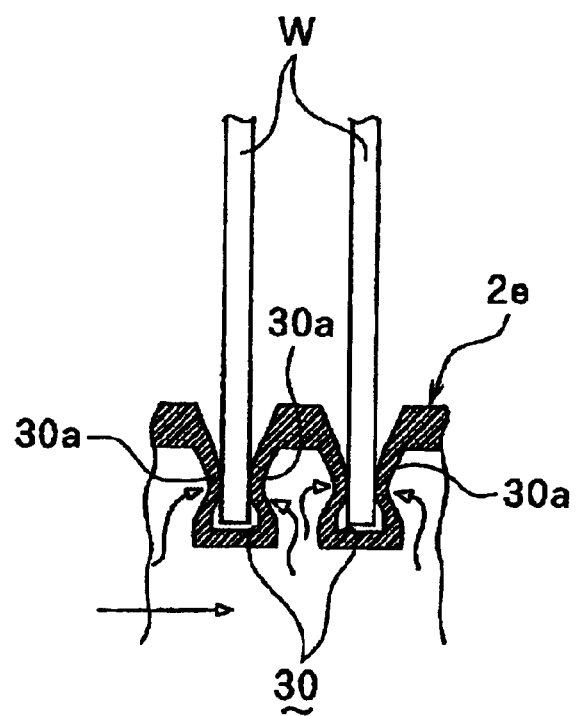

FIGS. 9A and 9B are schematic sectional views of the rotary substrate processing apparatus in accordance with the second embodiment of the present invention. FIGS. 10A and 10B are enlarged sectional views showing an essential part of the wafer holding member of the second embodiment. In detail, FIG. 10A is a view showing a condition to hold the wafers loose, while FIG. 10B is a view showing a condition to hold the wafers strongly.

In the rotary substrate processing apparatus of the second embodiment, the holding member has a function capable of changing a pressure applied on the wafers by the adoption of fluid pressure. For example, the apparatus is equipped with the rotor 1 for holding the wafers w by making use of pneumatic pressure. That is, as similar to the first embodiment of the invention, the apparatus includes the rotor 1 having the holding member 2 for holding a plurality of wafers W, for example, twenty six pieces of wafers W arranged at appropriate intervals, a motor 4A (as a rotating unit) for rotating the rotor 1 at variable speeds and the CPU 50 (as a controller) that controls the number of revolutions (rotating speed) of the motor 4A.

As similar to the first embodiment, the above holding member 2 comprises a pair of open/close holding rods 3 which are moved to open and close the rotor 1 when the wafers W are inserted into the holding space 80 by the wafer moving mechanism 77 (see FIG. 13), and a plurality of (four) fixed holding rods 2a to 2d for holding the wafers W in cooperation with the open/close holding rods 3. At least one of the fixed holding rods 2a to 2d, for example, the fixed holding rod 2e is equipped with a plurality of (e.g. twenty-six) elastically-deformable holding grooves 30 which can be swollen toward the peripheral portions of the wafers W by charging a pressure of fluid on supply, for example, pneumatic pressure.

The above fixed holding rod 2e has a fluid introductory path 31 formed between a rod body 30A and the grooves 30 so as to extend along the axial direction and also communicate with the backside of sidewalls 30a defining the holding grooves 30. The fluid introductory path 31 also communicates with an air source 35 through a first communication path 32 formed in the first disc 15a of the rotor 1, a second communication path 33 penetrating through the rotary drive shaft 20 and a fluid pipe line 34. Then, in the fluid pipe line 34, there are interposed a valve 36, an accumulator 37, a flow control valve 40 consisting of a check valve 38 and a variable choke 39 and a pressure detecting switch 41, in order from the air source 35 toward the fixed holding rod 2e. The pressure detecting switch 41 is electrically connected to the CPU 50. The detection signal from the pressure detecting switch 41 is transmitted to the CPU 50, while the control signal from the CPU 50 is transmitted to the flow control valve 40. The control signals from the CPU 50 are transmitted to the valve 36 and the motor 4A.

The rotary drive shaft 20 is connected to a drive shaft 4a of the motor 4A (as a rotating unit) through a coupling 44. Further, the second communication path 33 in the rotary drive shaft 20 communicates with a third communication path 42 of the drive shaft 4a. The fluid pipe line 34 is connected with one end of the drive shaft 4a through a rotary joint 43.

In the above descriptions, we explained the structure where the fluid pipe line 34 is connected with one side of the rotary drive shaft 20 and also the drive shaft 4a. The apparatus does not necessarily have to adopt this structure. As shown with two-dot chain line of FIG. 9A, the fluid pipe line 34 may be connected with the middle part of the rotary drive shaft 20.

Note, as the other parts of the apparatus of the second embodiment are identical to those of the first embodiment, elements identical to those of the first embodiment are indicated with the same reference numerals respectively and their overlapping descriptions are eliminated.

In the above descriptions, we explained the structure where at least one fixed holding rod 2e of the fixed holding rods 2b to 2e is equipped with plural, for example, twenty-six elastically-deformable holding grooves 30 swollen toward the peripheral portions of the wafers W by pressure of fluid on supply, for example, pneumatic pressure. In the modification, the open/close holding rod 3 may be equipped with plural, for example, twenty-six elastically-deformable holding grooves 30 swollen toward the peripheral portions of the wafers W by pressure of fluid on supply, for example, pneumatic pressure.

Next, the operation of the above-constructed rotary substrate processing apparatus of the second embodiment will be described. First, the no-shown drive cylinder moves the open/close holding rods 3 to their opening positions thereby to open the holding space 80 and thereupon, the wafers W are inserted into the holding space 80 by the wafer transporting mechanism 77. Next, the holding space 80 is closed by moving the open/close holding rods 3 to their closing positions, establishing a condition that the wafers W are retained in the rotor 1 while retreating the wafer transporting mechanism 77. In this way, the wafers W are supported by the fixed holding rods 2a to 2d and the open/close holding rods 3 and juxtaposed in parallel with each other.

Next, when the motor 4A rotates the rotor 1 through the rotary drive shaft 20 at predetermined revolutions, for example, 800 rpm, the valve 36 in the fluid pipe line 34 is simultaneously opened and the flow control valve 40 is activated, so that air of a designated flow rate flows in the fluid pipe line 34 and the sequent third communication path 42 and finally flows into the fluid introductory part 31 in the fixed holding rod 2e through the first communication path 32 in the first disc 15a of the rotor 1. Consequently, the sidewalls 30a defining the holding grooves 30 are displaced from their positions of FIG. 10A to the positions of FIG. 10B thereby to hold the peripheral portions of the wafers W strongly.

In this way, it becomes possible to rotate the wafers W as if they had followed the rotating rotor 1. In this state, there is performed a designated processing, for example, a cleaning process to spray chemical liquid or pure water against the wafers W or a drying process to rotate the rotor 1 at high speed upon quitting the supply of chemical liquid and pure water. In connection, if the flow control valve 40 is adjusted so as to reduce an amount of air on supply, the expansion of the holding grooves 30 is attenuated to produce a clearance between each holding groove 30 and each wafer W on the establishment of loosened holding condition. Then, it is possible to remove liquid and particles from the peripheral portions of the wafers W. Additionally, by slipping the wafers W under the loosened holding condition in the holding grooves 30, it is possible to clean even the wafers' portions which have been held by the sidewalls 30a, accompanied with improvement in cleaning process.

In the above-mentioned embodiment, we describe the rotary substrate processing apparatus of the invention as an independent apparatus. In the modification, the rotary substrate processing apparatus may be embodied in the form of a cleaning system equipped with the same apparatus.

Figure 11:
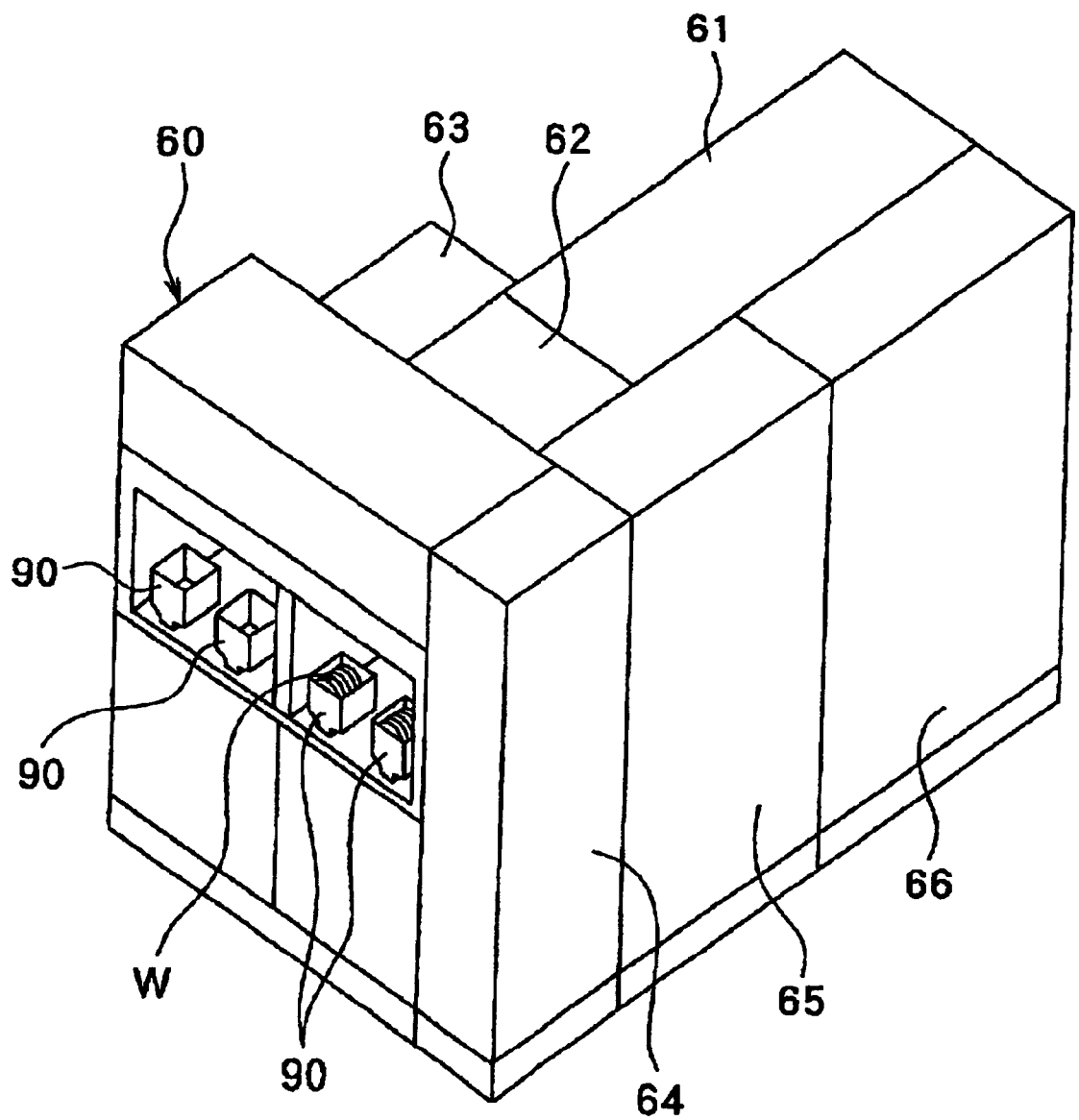
FIG. 11 is a perspective view showing a cleaning system equipped with the rotary substrate processing apparatus of the invention.
Figure 12:
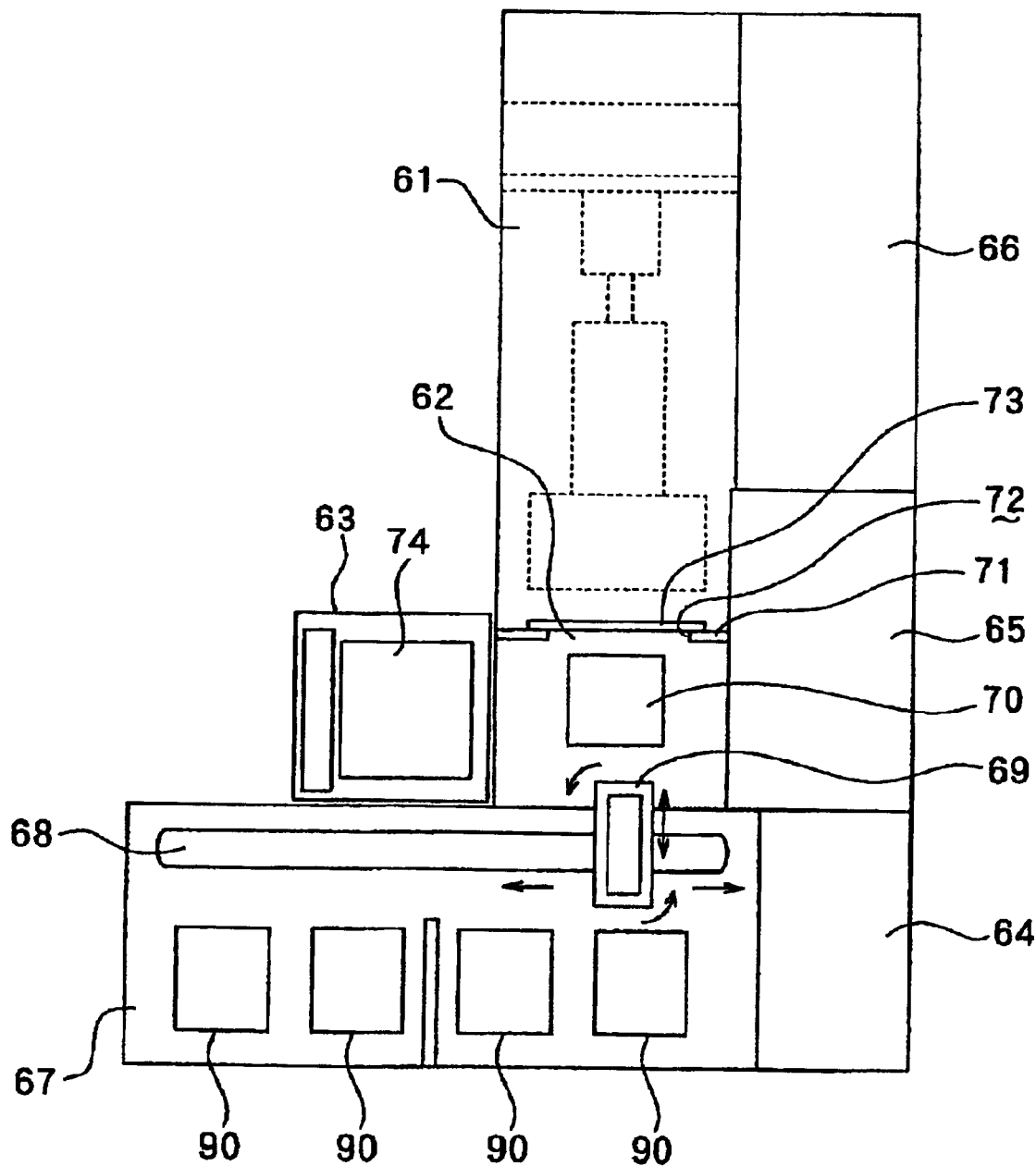
FIG. 12 is a schematic plan view of the cleaning system of FIG. 11.

As shown in FIGS. 11 and 12, the cleaning system includes a container loading/unloading part 60 where carriers 90 capable of accommodating the wafers W are loaded or unloaded, a cleaning unit 61 that applies cleaning and drying processes etc. on the wafers W, a stage part 62 for loading and unloading the carriers 90 to and from the cleaning unit 61, a carrier cleaning unit 63 for cleaning the carriers 90, a carrier stock 64 for stocking a plurality of carriers 90, a power unit 65 and a chemical tank box 66.

The container loading/unloading part 60 includes a mounting table 67 adapted to mount four carriers 90 thereon and a carrier transfer mechanism 69 that can move on a transfer path 68 formed along the carriers 90 in arrangement. Owing to the provision of the carrier transfer mechanism 69, the carriers 90 on the mounting table 67 can be transferred to the stage part 62 and conversely, the carriers 90 on the stage part 62 can be transferred to the mounting table 67. In this case, the single carrier 90 is capable of accommodating the wafers W of the plural number, for example, twenty-six wafers W. Further, the carrier 90 is adapted so as to arrange the surfaces of the wafers W vertically.

The stage part 62 is provided with a stage 70 for mounting the carrier 90 thereon. The carrier 90 brought from the container loading/unloading part 60 onto the stage 70 is loaded into the cleaning unit 61 by the carrier transfer mechanism 69, while the carrier 90 is unloaded from the cleaning unit 61 to the stage 70 (see FIG. 13).

Note, since the carrier 90 is transferred from the mounting table 67 onto the stage 70 by rotating an arm of the carrier transfer mechanism 69, the direction of the carrier 90 on the stage 70 is opposite to that of the carrier 90 on the mounting table 67. Therefore, the stage 70 is provided with a reverse mechanism (not shown) for recovering the direction of the carrier 90.

A partition wall 71 is arranged between the stage part 62 and the cleaning unit 61 and has an opening 72 formed to load and unload the carrier 90. The opening 72 can be closed by a shutter 73. During the processing, the shutter 73 is closed. While, in loading or unloading the carrier 90, the shutter 73 is opened.

The carrier cleaning unit 63 has a carrier cleaning bath 74 in which the emptied carrier 90 as a result of taking the wafers W out is cleaned.

The carrier stock 64 is provided to allow the emptied carrier 90 where the wafers (before cleaning) W are taken out to stand by temporarily and allow the emptied carrier 90 for accommodating the wafers (after cleaning) W to stand by in advance temporarily. The carrier stock 64 is capable of stocking a plurality of carriers 90 in the vertical direction and is also equipped with a carrier transporting mechanism which operates to mount a specified carrier 90 on the mounting table 67 and further position the carrier 90 in a designated position in the stock 64.

Figure 13:
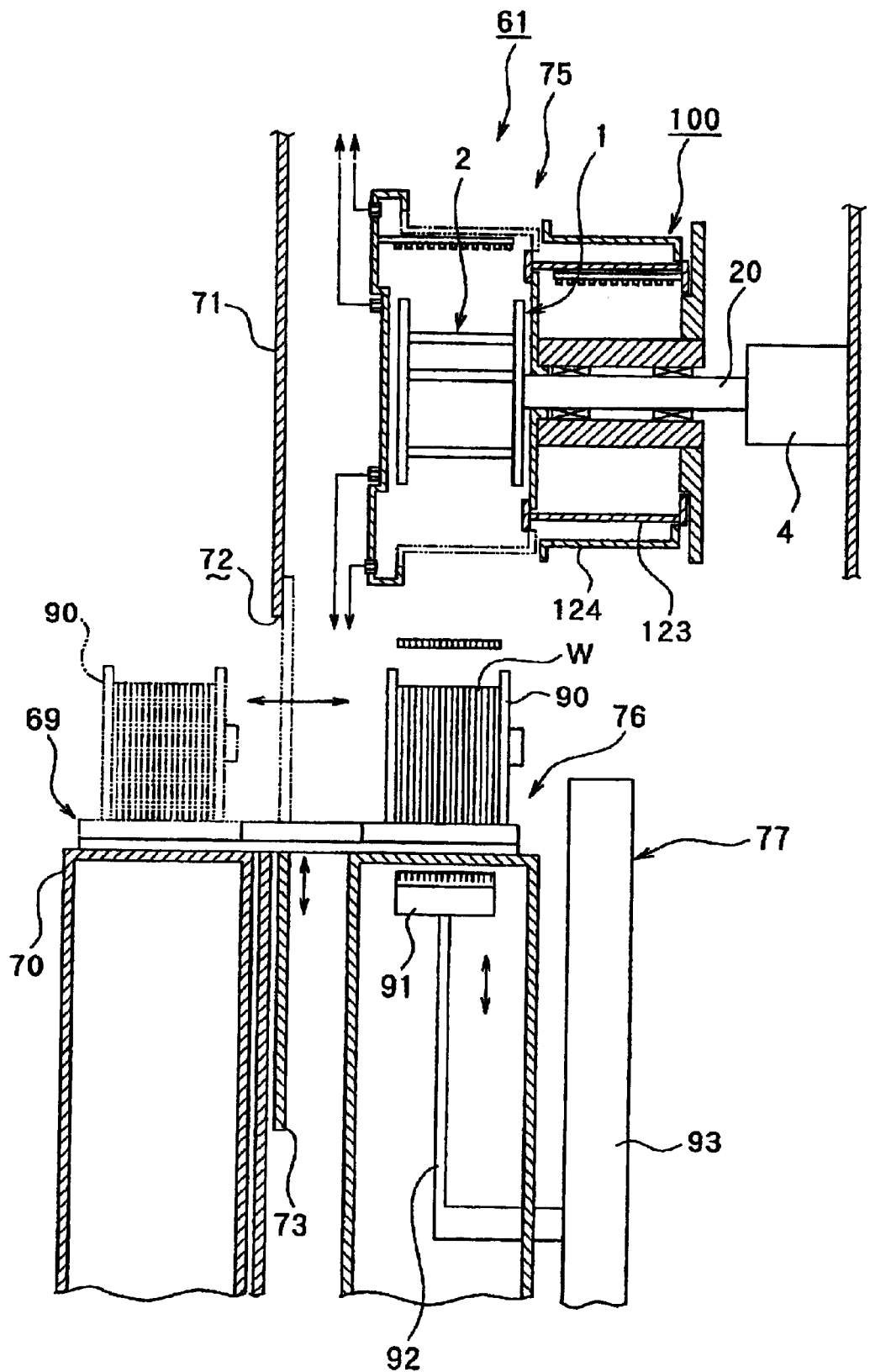
FIG. 13 is a schematic sectional view showing a double-chamber type liquid processing apparatus to which the rotary substrate apparatus of the invention is applied.

On the other hand, as shown in FIG. 13, the cleaning unit 61 comprises a cleaning part 75, a carrier stand-by part 76 to make the carrier 90 stand by just below the cleaning part 75 and a wafer transporting mechanism 77 which carries a plurality of wafers W at the cleaning part 75 to accommodate them in the carrier 90 at the carrier stand-by part 76. In the embodiment, the wafer transporting mechanism 77 includes a wafer holding member 91 for holding the wafers W, a supporting member 92 arranged vertically to support the wafer holding member 91 and an elevating part 93 for moving the wafer holding member 91 up and down through the supporting member 93, as shown in FIG. 13.

The cleaning part 75 is provided to remove resist mask, polymer layer as etching residuals, etc. from the wafers W after the etching process. Thus, the cleaning part 75 is embodied in the form of a double-chamber type liquid processing apparatus on the application of the rotary substrate processing apparatus of the invention. The double-chamber type liquid processing apparatus on the application of the rotary substrate processing apparatus of the first embodiment will be described below.

Figure 14:
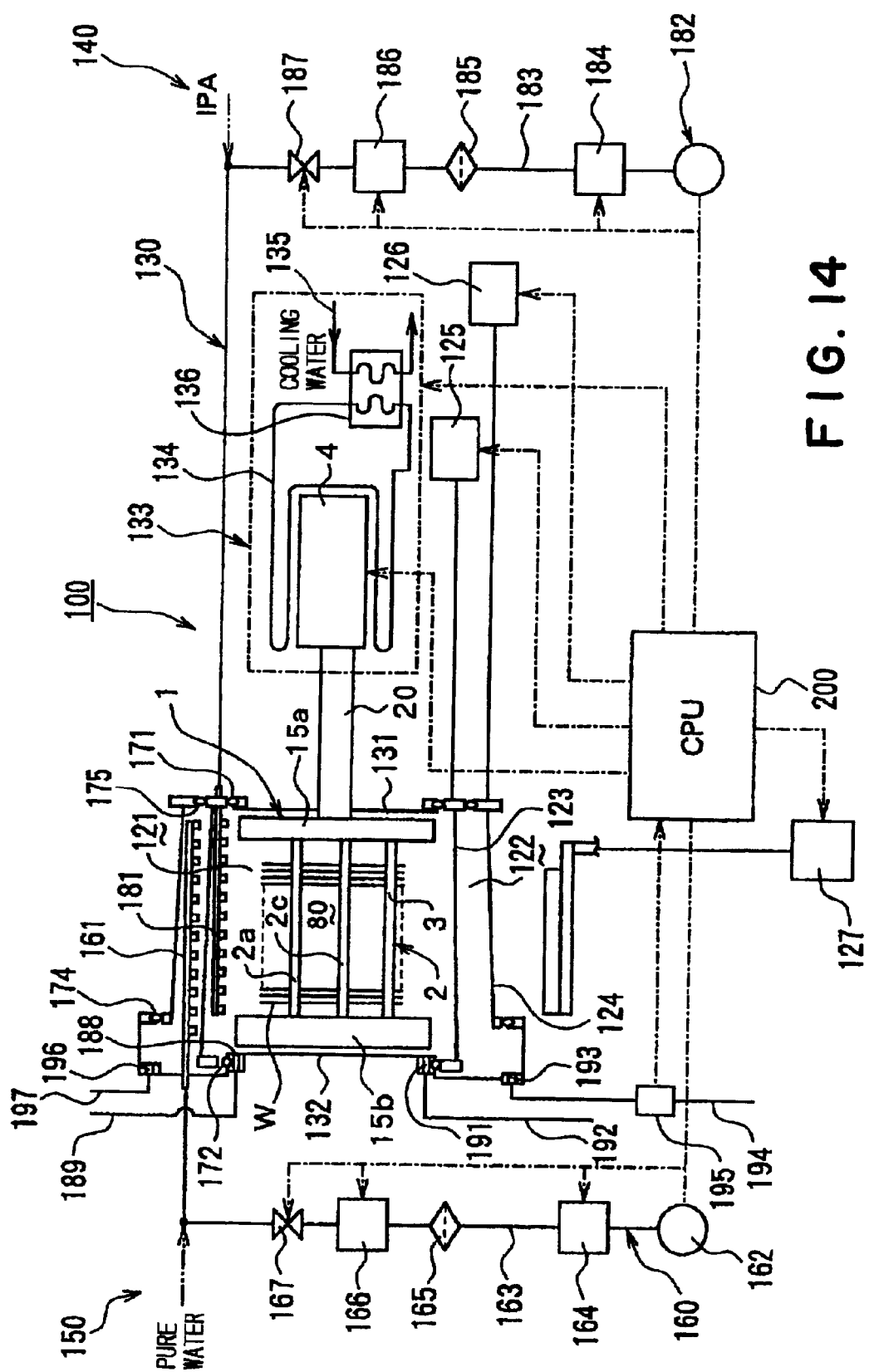
FIG. 14 is a view showing a schematic structure of the double-chamber type liquid processing apparatus of FIG. 13.

As shown in FIGS. 13 and 14, the double-chamber type liquid processing apparatus 100 mainly comprises the rotor 1 (as rotatable holder) for holding the wafers W, the motor 4 (as driver) for rotating the rotor 1 about the horizontal axis as a rotational center, an inner chamber 121 and an outer chamber 122 (as a plurality of processing chambers) both surrounding the wafers W held by the rotor 1, a chemical supplier 130 for supplying the wafers W accommodated in the inner chamber 121 or the outer chamber 122 with a processing fluid (chemical liquid), for example, resist stripper and polymer remover, a chemical-solvent supplier 140 for supplying a solvent (isopropyl alcohol-IPA) for the above chemical liquid, a rinsing-liquid supplier 150 for supplying a rinsing liquid (e.g. pure water) or a dry-fluid supplier 160 for supplying a dry gas, such as inert gas (e.g. nitrogen gas-N2) and fresh air, and a moving mechanism (e.g. a first cylinder 125 and a second cylinder 126) for moving both of an inner cylinder 123 defining the above inner chamber 121 and an outer cylinder 124 defining the above outer chamber 122 between their surrounding positions to encircle the wafers W and their stand-by positions apart from the surrounding positions.

In the above-constructed double-chamber type liquid processing apparatus 100, there is provided a controller, for example, a central processing unit 200 (referred "CPU 200" after) in order to control the operations of the following elements of: the motor 4; respective supply units of the suppliers 130, 140, 150, 160; the wafer transporting mechanism 77 etc.

The drive shaft 20 of the rotor 1 is rotatably supported by a first fixed wall 131 through a bearing (not shown). Owing to the provision of a labyrinth seal (not shown) succeeding to the above bearing in the first fixed wall 131, it becomes possible to prevent particles etc., which have been produced on the side of the motor 4, from invading the interior of the processing chambers. The motor 4 is housed in a fixed cylinder (not shown) succeeding to the first fixed wall 131. In accordance with programs stored in the CPU 200 in advance, the motor 4 is controlled so as to perform a designated high-speed rotations (e.g. 100 to 3000 rpm) and also a designated low-speed rotations (e.g. 1 to 500 rpm) selectively and repeatedly. In connection, it is noted that the range of revolutions defined in the above low-speed rotations partially overlaps with the same defined in the above high-speed rotations. It means that the low-speed rotations and high-speed rotations are respectively established in correspondence with stickiness of the chemical liquids. Thus, in case of the identical chemical liquid, the range of revolutions in the low-speed rotations does not overlap with the same in the high-speed rotations. Note, this establishment about revolutions will be applied to the following descriptions, as well. Hereat, the term "low-speed rotations" means a low speed in comparison with the number of revolutions in case of shaking the chemical liquid from the wafers W by centrifugal force. To the contrary, the term "high-speed rotations" means a high speed in comparison with the number of revolutions allowing the supplied chemical liquid to react on the wafers W sufficiently.

Therefore, it is feared that the motor 4 is overheated by the repetition of switching operation between the low-speed rotations and the high-speed rotations. In this view, the motor 4 is provided with a cooler 133 for preventing an overheating of the motor 4. As shown in FIG. 14, this cooler 133 is formed by a circulation-type cooling pipe 134 arranged around the motor 4 and a heat exchanger 136 containing the cooling pipe 134 and also a cooling-water supply pipe 135 both partially thereby to cool a coolant liquid enclosed in the cooling pipe 134. Employed as the above coolant liquid is electrical insulative and heat-conductive liquid (e.g. ethylene glycol) that would not cause a leak of electricity in the motor 4 if the same coolant liquid leaks out of the pipe 134. For its possibility to operate on a basis of signals detected by a not-shown temperature sensor, the cooler 133 is controlled by the CPU 200.

On the other hand, the inner chamber 121 (the first processing chamber) is defined by the first fixed wall 131, a second fixed wall 132 facing onto the first fixed wall 131 and the inner cylinder 123 engaging with the first fixed wall 131 and the second fixed wall 132 through first and second sealing members 171, 172, respectively. When the expansion of the first cylinder 125 as the moving mechanism causes the inner cylinder 123 to move to a position to encircle the rotor and the wafers W, the inner cylinder 123 is sealed to the first fixed wall 131 through the first sealing member 171 and also sealed to the second fixed wall 132 through the second sealing member 172, defining the inner chamber 121 (the first processing chamber). While, the shrinkage of the first cylinder 125 causes the inner cylinder 123 to move to a position (stand-by position) in the circumference of the fixed cylinder. Then, an opening at the leading end of the inner cylinder 123 is sealed to the first fixed wall 131 through the first sealing member 171 and simultaneously, the base end of the inner cylinder 123 is sealed to the intermediate part of the fixed cylinder through a third sealing member (not shown). In this way, it becomes possible to prevent the atmosphere of chemical liquid remaining in the inner chamber 121 from leaking outside. Note, the inner cylinder 123 is formed by a stainless steel member exhibiting chemical-resistance and high strength. In view of improvement in heat retaining capability, more preferably, the inner cylinder 123 is made from stainless steel coated or pasted with fluorine-type synthetic resin, such as PTFE, PFA, etc. Alternatively, the inner cylinder 123 itself is made of fluorine-type synthetic resin, such as PTFE, PFA, etc.

When the expansion of the second cylinder 126 as the moving mechanism causes the outer cylinder 124 forming the outer chamber 122 (the second processing chamber) to move to a position to encircle the rotor and the wafers W, the outer cylinder 124 is sealed to the second fixed wall 132 through the fourth sealing member 174 and also sealed to the inner cylinder 123 through the fifth sealing member 175 positioned outside of the tip of the inner cylinder 123, defining the outer chamber 122 (the second processing chamber). While, the shrinkage of the second cylinder 126 causes the outer cylinder 124 to move to a position (stand-by position) in the circumference of the fixed cylinder. Then, the base end of the outer cylinder 124 is sealed to the base end of the inner cylinder 123 through the fifth sealing member 175. Thus, since the inside atmosphere of the inner chamber 121 and the inside atmosphere of the outer chamber 122 are insulated from each other in a leak-tight manner, it is possible to prevent the atmospheres in the chambers 121, 122 from being mixed with each other, preventing an occurrence of cross-contamination as a result of reaction between different processing fluids.

As similar to the inner cylinder 123, the outer cylinder 124 is formed by a stainless steel member exhibiting chemical-resistance and high strength. In view of improvement in heat retaining capability, more preferably, the outer cylinder 124 is made from stainless steel coated or pasted with fluorine-type synthetic resin, such as PTFE, PFA, etc., as similar to the inner cylinder 123. Alternatively, the outer cylinder 124 itself is made of fluorine-type synthetic resin, such as PTFE, PFA, etc.

The above-constructed inner and outer cylinders 123, 124 are together tapered so as to gradually spread as directing toward the leading ends of the cylinders. Further, the inner and outer cylinders 123, 124 are adapted so as to coaxially project from each other and also overlap with each other by the expansion and shrinkage of the first and second cylinders 125, 126.

In this way, owing to the tapered formation of the inner and outer cylinders 123, 124 both spreading gradually as directing toward the leading ends of the cylinders, when the rotor 1 is rotated in the inner cylinder 123 or the outer cylinder 124 at processing, the resultant air current flows in a spiral manner, toward the expanded side of the cylinder. Consequently, it becomes possible to facilitate the discharge of chemical liquid etc. in the cylinder from its expanded side.

Additionally, owing to the coaxial arrangement of the inner cylinder 123 and the outer cylinder 124, it is possible to reduce a space necessary for the inner and outer cylinders 123, 124 and the inner and outer chambers 121, 122, allowing of miniaturization of the apparatus.

As shown in FIG. 14, the chemical supplier 130 has a chemical nozzle 181 attached in the processing chamber, i.e., the inner cylinder 123, a chemical supply part 182, a pump 184 interposed in a chemical pipe line 183 connecting the nozzle 181 with the supply part 182, a filter 185, a heat regulator 186 and a chemical supply valve 187.

Through a first drain pipe 192, the chemical supply part 182 is connected to a first drain port 191 formed at the lowermost part on the expanded side of the inner chamber 121. Further, the first drain pipe 192 is connected to a circulation pipeline (not shown) through a not-shown switching valve (switching unit). Note, at the uppermost part on the expanded side of the inner chamber 121, a first exhaust port 188 is arranged and connected to a first exhaust pipe 189 having a not-shown closing valve interposed therein.

The outer chamber 122 is provided, at its lower part on the expanded side, with a second drain port 193 to which a second drain pipe 194 having a not-shown valve interposed therein is connected. Note, the second drain pipe 194 includes a specific resistance meter 195 for detecting a specific resistance of pure water. Thus, the specific resistance of pure water supplied for rinsing is detected by the specific resistance meter 195 and a signal representing the detected specific resistance is transmitted to the CPU 200. Therefore, since the specific resistance meter 195 allows the present rinsing situation to be monitored, it is possible to finish the rinsing process on completion of appropriate rinsing process.

The outer chamber 122 is provided, at its upper part on the expanded side, with a second exhaust port 196 to which a second exhaust pipe 197 having a not-shown valve interposed therein is connected.

As shown in FIG. 14, the dry-fluid supplier 160 includes a dry-fluid supply nozzle 161 attached to the second fixed wall 132, a dry-fluid (e.g. nitrogen gas —$N_2$) supply source 162, a valve 164 arranged in a dry-fluid supply pipe line 163 connecting the dry-fluid supply nozzle 161 with the $N_2$ supply source 162, a filter 165 and a $N_2$-temperature regulator 166. Connected with the secondary side of the $N_2$-temperature regulator 166 of the pipe line 163 through a switching valve 167 is a branch pipe line (not shown) which is branched from the above IPA supply pipe line (not shown).

In this case, the dry-fluid nozzle 161 is positioned outside of the inner chamber 121 and inside of the outer chamber 122. With the arrangement, when the inner cylinder 123 retreats to the stand-by position and the outer cylinder 124 moves to the position to surround the rotor 1 and the wafers W thereby to define the outer chamber 122, then the nozzle 161 is positioned in the outer chamber 122 to supply the wafers W with a mixture fluid of $N_2$-gas and IPA in the form of mist. After drying the wafers W by the mixture of $N_2$-gas and IPA, the wafers W are further dried by $N_2$-gas only. Although the dry fluid corresponds to the mixture of $N_2$-gas and IPA in the above description, this mixture fluid may be replaced with only $N_2$-gas in the modification.

As to the chemical supplier 130, the IPA supplier 140, the pure-water supplier 150 and the dry-fluid supplier 160, it is noted that the control 200 controls the operations of the pump 184, the heat regulator 186, the $N_2$-temperature regulator 166, the chemical supply valve 187, the IPA supply valve (not shown) and the switching valve 167 (see FIG. 14).

The above-constructed double-chamber type liquid processing apparatus operates as follows. First, by the carrier transporting mechanism 69, the carrier 90 is transferred from the side of the container loading/unloading part 60 to the carrier stand-by part 76 and finally mounted on the stage 70. Thereafter, the wafer transporting mechanism 77 rises to insert the wafers W into the rotor 1 having the open/close holding rods 3 opened outward and delivers the wafers W to the fixed holding rods 2a to 2d and the open/close holding rods 3 in the closed positions. After the delivery of the wafers W, a not-shown locking unit is activated to lock the open/close holding rods 3. Subsequently, the wafer transporting mechanism 77 returns to the original position.

Once the wafers W are positioned in the rotor 1 in the above way, the inner cylinder 123 and the outer cylinder 124 move to their positions to surround (accommodate) the wafers W, so that they are accommodated in the inner chamber 121. In this state, the chemical liquid is supplied from the chemical nozzle 181 to carry out the chemical processing. In this chemical processing, it is carried out to supply the chemical liquid for a predetermined period, e.g. dozens of seconds while rotating the rotor 1 and the wafers W at a low speed (e.g. 1 to 500 rpm) and thereafter, the supply of the chemical liquid is stopped. Next, the rotor 1 and the wafers W are rotated at a high speed (e.g. 100 to 3000 rpm) for several seconds to shake off the chemical liquid adhering to the surfaces of the wafers W. The chemical supply process and chemical shaking process are repeated by several times to thousands of times for completion of the chemical processing. After the circulatory supply of the chemical liquid for a predetermined period, a new chemical liquid in the chemical supply part 182 is supplied to the side of the processing chamber thereby to complete the chemical processing.

After completing the chemical processing in the aboveway, it is started to supply the wafers W with IPA on condition that the wafers W are accommodating in the inner chamber 121. In detail, while rotating the wafers W accommodated in the inner chamber 121 at a low speed, for example, 1 to 500 rpm, IPA is supplied through the chemical nozzle 181 also serving as the IPA nozzle of the IPA supplier 140, for a predetermined period (e.g. dozens of seconds) and thereafter, the supply of IPA is stopped. Subsequently, the rotor 1 and the wafers W are rotated at a high speed, e.g. 100 to 3000 rpm for several seconds thereby to shake and remove IPA adhering to the surfaces of the wafers W. This chemical removal processing is completed by the repetition of both IPA-supply process and IPA-removal process from several times to thousands of times. Also in this chemical removal processing, IPA on the first supply coincides with a chemical liquid stored in a supply tank (not shown), as similar to the previously-mentioned chemical processing. Thereafter, the firstly-used IPA is thrown away. Subsequently, IPA stored in the above supply tank (not shown) is supplied to the wafers W, in circulation. At the end of the chemical removing processing, a new IPA liquid supplied from the IPA source into the supply tank is used. In this way, the chemical removal processing is completed.

After completing the chemical processing and the sequent rinsing process, the inner cylinder 123 retreats to its stand-by position, so that the rotor 1 and the wafers W are surrounded by the outer cylinder 124. In other words, the wafers W are accommodated in the outer chamber 122. Therefore, even if liquid falls from the wafers W on the processing in the inner chamber 121, the outer chamber 124 can catch droplets. In the above condition, the rinsing liquid (e.g. pure water) is first supplied to the rotating wafers W through a pure-water nozzle (not shown) of a rinsing-liquid supplier. The pure water supplied in the rinsing process and the removed IPA are discharged from the second drain pipe 194 through the second drain port 193. Further, gas produced in the outer chamber 122 is discharged out of the second exhaust pipe 197 through the second exhaust port 196.

After completing the rinsing process for a predetermined period in the above way, it is carried out to supply the rotating wafers W with a mixture fluid of $N_2$-gas and IPA from the $N_2$-gas source 162 of the dry-fluid supplier and an IPA source (not shown). As a result, pure water sticking to the wafers' surfaces is eliminated to accomplish the drying process of the wafers W and also the interior of the outer chamber 122. Additionally, when the wafers W after the drying process by the mixture fluid of $N_2$-gas and IPA are further supplied with only $N_2$-gas, it is possible to carry out the drying of wafers W and the outer chamber 122 more effectively.

After the chemical processing, the chemical removal processing, the rinsing process and the drying process are all completed, the outer cylinder 124 retreats to the stand-by position outside of the inner cylinder 123. On the other hand, the wafer transporting mechanism 77 rises to the underside of the rotor 1 and then, a not-shown unlocking unit operates to allow the open/close holding rods 3 to retreat back from their positions to support the wafers W. Consequently, the wafer transporting mechanism 77 receives the wafers W held by the fixed holding rods 2a to 2d and continuously moves below the processing apparatus 100. Then, the wafers W below the apparatus 100 are transported to the loading/unloading part by the wafer transporting mechanism 77. Alternatively, the wafers W are directly accommodated in the wafer carrier and thereafter, they are transported out of the apparatus.

Also in the above double-chamber type liquid processing apparatus, as the centrifugal force due to the rotation of the rotor 1 causes the press members 5 on the fixed holding rod 2a to move toward the peripheral portions of the wafers W and also causes the press pieces 3c of the press bodies 3 of the open/close holding rods 3 to move toward the peripheral portions of the wafers W, they rotate while following the rotation of the rotor 1. During this rotation, the liquid remained on the fixed holding rods 2a to 2d and the open/close holding rods 3, flows out through the drain holes 5i and the shake-off grooves 3e instantly. Additionally, the number of revolutions of the rotor 1 may be reduced to define clearances between the fixed holding rods 2a to 2d, the open/close holding rods 3 and the wafers W. Then, it is possible to exclude liquid and particles adhering to the peripheral portions of the wafers W. That is, as the liquid does not continue staying in the guide grooves and the plate bodies, the drying period for the wafers W and the rotor 1 can be shortened. In addition, when switching the liquid on use from the chemical liquid to pure water, it is possible to replace the chemical liquid with pure water more quickly. Particularly, in case of an apparatus having movable chambers (i.e. the inner cylinder 123 and the outer cylinder 124) like the above double-chamber type liquid processing apparatus, the reduction in the number of revolutions of the rotor is more preferable since it is required to dry wafer-holding parts (e.g. the fixed holding rods 2a to 2d, the open/close holding rods 3) as soon as possible.

In the above descriptions, the rotary substrate processing apparatus of the first embodiment is applied to the double-chamber type liquid processing apparatus. Of course, the application of the rotary substrate processing apparatus of the second embodiment would be effective as well.

Note, in the first embodiment mentioned above, we have explained one case that at least one fixed holding rod 2a of the rods 2a to 2d or the open/close holding rods 3 are equipped with a plurality of press members 5 and another case that at least one of the fixed holding rods 2a to 2d may be equipped with the press bodies 3d having the elastically-deformable press pieces 3c, as similar to the open/close holding rods 3. Additionally, in the second embodiment, we have explained one case that at least one fixed holding rod 2e of the rods 2a to 2d or the open/close holding rods 3 are provided with a plurality of (e.g. twenty-six) elastically-deformable holding grooves 30 to be swollen against the peripheral portions of the wafers W by fluid pressure, such as pneumatic pressure. In the modification, the structure of the first embodiment may be combined with the structure of the second embodiment. In detail, for example, at least one of the fixed holding rods 2a to 2e is provided with (A) the plural press members 5, (B) the press bodies 3d having the elastically-deformable press pieces 3c, or (C) the plural (e.g. twenty-six) elastically-deformable holding grooves 30 to be swollen against the peripheral portions of the wafers W by fluid pressure, such as pneumatic pressure. Similarly, each of the open/close holding rods 3 is provided with (A) the plural press members 5, (B) the press bodies 3d having the elastically-deformable press pieces 3c, or (C) the plural (e.g. twenty-six) elastically-deformable holding grooves 30 to be swollen against the peripheral portions of the wafers W by fluid pressure, such as pneumatic pressure. This modification is accomplished by optionally combining at least one fixed holding rod having one of the above structures (A), (B) and (C) with the open/close holding rods 3 each having one of the above structures (A), (B) and (C).

Although the above-mentioned embodiments are commonly directed to the substrate processing apparatus/method for processing the semiconductor wafers W, of course, the present invention is also applicable to a processing apparatus/method for processing the other substrates, for example, LCD substrate, CD (compact disc), etc.

What is claimed is:

1. A rotary substrate processing apparatus comprising:
a rotor having a holding member for holding a plurality of substrates at intervals; and
a motor for rotating the rotor, the motor being adjustable in its revolutions, wherein
the holding member includes at least one open/close holding rod which moves to open or close the rotor in inserting the substrates into the rotor and a plurality of constant-position holding rods for holding the substrates in cooperation with the open/close holding rod; and
at least one of the constant-position holding rods has a plurality of press members that are moved toward peripheral portions of the respective substrates by centrifugal force due to the rotation of the rotor thereby to press the substrates.

2. The rotary substrate processing apparatus as claimed in claim 1, wherein the press members have respective fitting holes into which a single support shaft is inserted in common, the press members being adapted so as to be slidable in the circumferential direction of the support shaft.

3. The rotary substrate processing apparatus as claimed in claim 1, wherein the open/close holding rod includes a press body having a press piece capable of elastic deformation, the press piece being adapted so as to move toward peripheral portions of the respective substrates by centrifugal force due to the rotation of the rotor thereby to press the substrates.

4. The rotary substrate processing apparatus as claimed in claim 1, wherein the open/close holding rod is provided with elastically-deformable holding grooves which are swollen toward peripheral portions of the respective substrates by pressure of a fluid supplied to the open/close holding rod thereby to press the substrates.

5. The rotary substrate processing apparatus as claimed in claim 1, wherein the press members comprises:

a plate body rotatably fitted to a support shaft, the plate body having a press part formed on a circumferential face of the plate body;
a weight embedded in the plate body in an eccentric position thereof; and
a guide groove formed in the plate body, for engagement with a rotation stopper shaft with play, the rotation stopper shaft being arranged to extend in parallel with the support shaft.

6. The rotary substrate processing apparatus as claimed in claim 5, wherein each of the press members has at least one discharge groove formed on its surface perpendicular to the support shaft to extend from the center of the support shaft outward.

7. The rotary substrate processing apparatus as claimed in claim 5, wherein the plate body is provided with a drain hole which communicates a sliding face of the plate body on the support shaft with the circumferential face of the plate body.

8. A rotary substrate processing apparatus comprising:
a rotor having a holding member for holding a plurality of substrates at intervals; and
a motor for rotating the rotor, the motor being adjustable in its revolutions, wherein
the holding member includes at least one open/close holding rod which moves to open or close the rotor in inserting the substrates into the rotor and a plurality of constant-position holding rods for holding the substrates in cooperation with the open/close holding rod; and
the at least one open/close holding rod and/or at least one of the constant-position holding rods includes a press body having an elastically-deformable press piece adapted so as to move toward peripheral portions of the respective substrates by centrifugal force due to the rotation of the rotor thereby to press the substrates.

9. The rotary substrate processing apparatus as claimed in claim 8, wherein the open/close holding rod includes a press body having an elastically-deformable press piece adapted so as to move toward peripheral portions of the respective substrates by centrifugal force due to the rotation of the rotor thereby to press the substrates.

10. The rotary substrate processing apparatus as claimed in claim 8, wherein at least one of the constant-position holding rod is provided with elastically-deformable holding grooves which are swollen toward peripheral portions of the respective substrates by pressure of a fluid supplied to the constant-position holding rod thereby to press the substrates.

11. A rotary substrate processing apparatus comprising:
a rotor having a pair of discs facing each other and a holding member interposed between the pair of discs for holding a plurality of substrates at intervals;
a rotary drive shaft connected with one of the discs for rotating the rotor; and
a motor connected with the rotary drive shaft for rotating the rotary drive shaft to drive the rotor, the motor being adjustable in its revolutions,
wherein the holding member includes at least one open/close holding rod which moves to open or close the rotor in inserting the substrates into the rotor and a plurality of constant-position holding rods for holding the substrates in cooperation with the open/close holding rod; and
at least one holding rod of the open/close holding rod and/or the constant-position holding rods includes elastically-deformable holding grooves which are swollen toward peripheral portions of respective substrates by pressure of a fluid supplied to the holding rod thereby to press the substrates, the holding rod having the elastically-deformable holding grooves including a fluid introductory path so as to provide pressured fluid for the elastically-deformable holding grooves, one of the discs having a first communication path connected with the fluid introductory path, and the rotary drive shaft having a second communication path connected with the first communication path on one end and communicated to a fluid source at the other end.

12. The rotary substrate processing apparatus as claimed in claim 11, further comprising a pressure controller which controls the pressure of the fluid supplied to the holding rod.

* * * * *